United States Patent
Cha et al.

(10) Patent No.: US 9,525,102 B2
(45) Date of Patent: Dec. 20, 2016

(54) METHOD FOR MANUFACTURING NANOSTRUCTURE SEMICONDUCTOR LIGHT EMITTING DEVICE

(71) Applicant: SAMSUNG ELECTRONICS CO., LTD., Suwon-si (KR)

(72) Inventors: Nam-Goo Cha, Ansan-si (KR); Geon-Wook Yoo, Seongnam-si (KR); Han-Kyu Seong, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/764,349

(22) PCT Filed: Jan. 28, 2014

(86) PCT No.: PCT/KR2014/000811
§ 371 (c)(1),
(2) Date: Jul. 29, 2015

(87) PCT Pub. No.: WO2014/119910
PCT Pub. Date: Aug. 7, 2014

(65) Prior Publication Data
US 2015/0372186 A1    Dec. 24, 2015

(30) Foreign Application Priority Data

Jan. 29, 2013   (KR) .................. 10-2013-0010110
Dec. 26, 2013   (KR) .................. 10-2013-0164523

(51) Int. Cl.
*H01L 33/24*     (2010.01)
*H01L 33/08*     (2010.01)
(Continued)

(52) U.S. Cl.
CPC ............. *H01L 33/20* (2013.01); *H01L 33/005* (2013.01); *H01L 33/08* (2013.01); *H01L 33/18* (2013.01); *H01L 33/24* (2013.01)

(58) Field of Classification Search
CPC ....... H01L 33/005; H01L 27/15; Y10S 977/70
(Continued)

(56) References Cited

U.S. PATENT DOCUMENTS 6,372,608 B1   4/2002   Shimoda et al.
6,645,830 B2   11/2003  Shimoda et al.
(Continued)

FOREIGN PATENT DOCUMENTS

JP   2001-284266 A   10/2001
JP   2008-066591 A    3/2008
(Continued)

OTHER PUBLICATIONS

Communication issued Oct. 5, 2015, issued by the United States Patent and Trademark Office in counterpart U.S. Appl. No. 14/165,112.
(Continued)

*Primary Examiner* — Moazzam Hossain
(74) *Attorney, Agent, or Firm* — Sughrue Mion, PLLC

(57) ABSTRACT

There is provided a method of manufacturing a nanostructure semiconductor light emitting device including providing a base layer formed of a first conductivity-type semiconductor, forming a mask including an etch stop layer on the base layer, forming a plurality of openings with regions of the base layer exposed therethrough, in the mask; forming a plurality of nanocores by growth of the first conductivity-type semiconductor on the exposed regions of the base layer to fill the plurality of openings, partially removing the mask using the etch stop layer to expose side portions of the plurality of nanocores, and sequentially growth of an active layer and a second conductivity-type semiconductor layer on surfaces of the plurality of nanocores.

13 Claims, 24 Drawing Sheets

(51) Int. Cl.
 *H01L 33/00* (2010.01)
 *H01L 33/20* (2010.01)
 *H01L 33/18* (2010.01)
(58) Field of Classification Search
 USPC .................................. 438/34; 257/E33.068
 See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,861,305 B2 | 3/2005 | Koike et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,427,772 B2 | 9/2008 | Chuo et al. | |
| 7,462,867 B2 | 12/2008 | Tezen | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,906,787 B2 | 3/2011 | Kang | |
| 7,940,350 B2 | 5/2011 | Jeong | |
| 7,947,989 B2 | 5/2011 | Ha et al. | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,030,664 B2 * | 10/2011 | Moon | H01L 33/0037 257/13 |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2002/0172820 A1* | 11/2002 | Majumdar | B82Y 10/00 428/357 |
| 2006/0223211 A1* | 10/2006 | Mishra | B82Y 10/00 438/41 |
| 2007/0037365 A1 | 2/2007 | Ranganath et al. | |
| 2007/0041214 A1* | 2/2007 | Ha | H01L 33/0079 362/612 |
| 2007/0257264 A1 | 11/2007 | Hersee et al. | |
| 2008/0157057 A1* | 7/2008 | Kim | H01L 33/06 257/13 |
| 2008/0246076 A1 | 10/2008 | Chen | |
| 2010/0193813 A1* | 8/2010 | Kao | H01L 33/20 257/98 |
| 2011/0114915 A1 | 5/2011 | Lee et al. | |
| 2012/0012968 A1 | 1/2012 | Konsek | |
| 2012/0061641 A1* | 3/2012 | Seong | H01L 27/156 257/13 |
| 2013/0153860 A1 | 6/2013 | Kim et al. | |
| 2013/0221322 A1* | 8/2013 | Ohlsson | B82Y 10/00 257/13 |
| 2013/0341658 A1* | 12/2013 | Lee | H01L 33/14 257/91 |
| 2014/0048902 A1* | 2/2014 | Raj | H01L 29/872 257/472 |
| 2014/0097401 A1* | 4/2014 | Robin | H01L 33/06 257/13 |
| 2014/0166974 A1 | 6/2014 | Yoo et al. | |
| 2014/0209859 A1 | 7/2014 | Cha et al. | |

FOREIGN PATENT DOCUMENTS

| | | |
|---|---|---|
| KR | 10-2007-0100852 A | 10/2007 |
| KR | 10-2008-0035578 A | 4/2008 |
| KR | 10-2009-0081693 A | 7/2009 |
| KR | 10-2011-0054318 A | 5/2011 |
| KR | 10-2011-0077300 A | 7/2011 |
| KR | 10-2012-0028104 A | 3/2012 |
| KR | 10-2012-0058137 A | 6/2012 |
| KR | 10-2014-0000818 A | 1/2014 |
| KR | 10-2014-0096980 A | 8/2014 |

OTHER PUBLICATIONS

Katsuhiro Tomioka, et al., "GaAs/AlGaAs Core Multishell Nanowire-Based Light-Emitting Diodes on Si,", Nano Letters, Published on Web: Apr. 8, 2010, Apr. 8, 2010, 10 (5), pp. 1639-1644 English.
Shunfeng Li, et al., "GaN based nanorods for solid state lighting", AIP, Journal of Applied Physics, 111, 071101-1 to 071101-23 2 Apr. 2, 2012), total 24 pages.
International Search Report for PCT/KR2014/000811 dated May 20, 2014 [PCT/ISA/210].

\* cited by examiner (a)  (b)

(a)　　　　　　　　(b)

METHOD FOR MANUFACTURING NANOSTRUCTURE SEMICONDUCTOR LIGHT EMITTING DEVICE

CROSS REFERENCE TO RELATED APPLICATIONS

This application is a national stage entry of International Application No. PCT/KR2014/000811, filed on Jan. 28, 2014, and claims the benefit of Korean Application No. 10-2013-0010110, filed on Jan. 29, 2013, and No. 10-2013-0164523, filed on Dec. 26, 2013, in the United States Patent and Trademark Office, the disclosures of which are incorporated herein by reference in their entireties.

TECHNICAL FIELD

The present inventive concept relates to a method of manufacturing a nanostructure semiconductor light emitting device.

BACKGROUND ART

A semiconductor light emitting device such as a light emitting diode (LED) is a device capable of generating light from materials included therein, through the conversion of energy generated by the recombination of electrons and holes into light. LEDs have been widely used in illumination devices, display devices and general light sources, and the development thereof has therefore tended to be accelerated.

DISCLOSURE

Technical Problem

An aspect of an exemplary embodiment provides a manufacturing method for a simplified nanostructure semiconductor light emitting device in which a nanostructure may be stably formed.

Technical Solution

According to an aspect of the present inventive concept, there is provided a method of manufacturing a nanostructure semiconductor light emitting device, the method comprising: providing a base layer formed of a first conductivity-type semiconductor; forming a mask including an etch stop layer on the base layer; forming a plurality of openings with regions of the base layer exposed therethrough, in the mask; forming a plurality of nanocores by growth of the first conductivity-type semiconductor on the exposed regions of the base layer to fill the plurality of openings; partially removing the mask using the etch stop layer to expose side portions of the plurality of nanocores; and sequentially growth of an active layer and a second conductivity-type semiconductor layer on surfaces of the plurality of nanocores.

The mask may include a first material layer formed on the base layer and provided as the etch stop layer, and a second material layer formed on the first material layer and having an etching rate lower than that of the first material layer.

The mask may include first to third material layers formed sequentially on the base layer, and the second material layer may be formed of a material different to that of the first and third material layers and may be provided as the etch stop layer.

The first and third material layers may be formed of the same material.

An etch stop level through the etch stop layer may be positioned at a depth equal to or below a point equal to ⅓ of the overall height of the mask, from an upper surface of the base layer.

An aspect ratio of the opening may be about 5:1 or higher.

The method may further include forming a diffusion preventing film formed of a material different to that of the mask on respective inner side walls of the plurality of openings, between the forming of the plurality of openings and the forming of the plurality of nanocores.

The forming of the diffusion preventing film may include forming a material film for the diffusion preventing film on the surface of the mask, and removing portions of the material film, positioned on an upper surface of the mask and the exposed regions of the base layer such that only the material film remains on an inner side wall of the opening.

The method may further include removing the diffusion preventing film from the exposed surface of the nanocores, before the sequential growth of the active layer and the second conductivity-type semiconductor layer.

After the removing of the diffusion preventing film, a portion of the diffusion preventing film positioned below an upper surface level of the etch stop layer may remain.

The method may further include heat treating the plurality of nanocores between the partial removing of the mask and the sequential growth of the active layer and the second conductivity-type semiconductor layer.

The heat treating of the plurality of nanocores may be performed at a temperature ranging from about 600 to about 1200° C.

The method may further include applying a planarizing process to upper surfaces of the plurality of nanocores to be planarized to have the same level.

At least a portion of the plurality of nanocores may have at least one of a cross section and an interval therebetween different to those of remaining nanocores.

According to an aspect of the present inventive concept, there is provided a nanostructure semiconductor light emitting device including: a base layer formed of a first conductivity-type semiconductor; a mask formed on the base layer and including a plurality of openings with regions of the base layer exposed therethrough; a plurality of light emitting nanostructures respectively formed on the exposed regions of the base layer, and including nanocores formed of a first conductivity-type semiconductor and an active layer and a second conductivity-type semiconductor layer formed sequentially on surfaces of the nanocores; and a diffusion preventing film located between the nanocore and an inner side wall of the opening.

Effect of Invention

A 3D nanostructure having a relatively high aspect ratio may be stably grown by allowing a mask to serve as a mold, whereby a light emitting area may be increased.

In addition, even in a case in which a growth height of a nanostructure is different due to uneven deposition according to regions in a crystal growth process, since a planarizing process may be easily applied, a uniform height in a final nanostructure may be secured. In particular, such a process may be usefully used in differentiating cross sections of nanostructures and an interval therebetween in order to implement multiple wavelengths of light, for example, white light.

The above and other aspects, features and other advantages will be more clearly understood from the following detailed description taken in conjunction with the following embodiments.

BRIEF DESCRIPTION OF THE DRAWINGS

FIGS. 47 through 50 are cross-sectional views illustrating respective main processes of a method of manufacturing a nanostructure semiconductor light emitting device according to another exemplary embodiment.

DETAILED DESCRIPTION OF EXEMPLARY EMBODIMENTS

Figure 1:
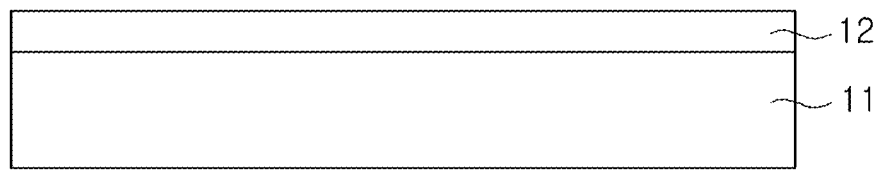
FIGS. 1 to 5 are cross-sectional views illustrating respective main processes of a method of manufacturing a nanostructure semiconductor light emitting device according to an exemplary embodiment of the inventive concept.

Exemplary embodiments of the present inventive concept will now be described in detail with reference to the accompanying drawings.

The inventive concept may, however, be exemplified in many different forms and should not be construed as being limited to the specific embodiments set forth herein. Rather, these embodiments are provided so that this disclosure will be thorough and complete, and will fully convey the scope of the inventive concept to those skilled in the art.

In the drawings, the shapes and dimensions of elements may be exaggerated for clarity, and the same reference numerals will be used throughout to designate the same or like elements.

FIGS. 1 to 5 are cross-sectional views illustrating respective main processes of a method of manufacturing a nanostructure semiconductor light emitting device according to an exemplary embodiment of the inventive concept.

The method of manufacturing a nanostructure semiconductor light emitting device according to an exemplary embodiment may initially provide a base layer 12 configured of a first conductivity-type semiconductor.

As illustrated in FIG. 1, the base layer 12 may be provided by growth of a first conductivity-type semiconductor on the substrate 11.

The substrate 11 may be an insulating, conductive, or semiconductor substrate, as necessary. The substrate 11 may be a crystal growth substrate for growth of the base layer 12. When the base layer 12 is formed of a nitride semiconductor, the substrate 11 may be selectively formed of sapphire, SiC, Si, $MgAl_2O_4$, MgO, $LiAlO_2$, $LiGaO_2$, or GaN.

The base layer 12 may electrically connect one ends of the plurality of light emitting nanostructures 15 to each other, as well providing a crystal growth surface for growth of the light emitting nanostructures 15 thereon. Therefore, the base layer 12 may be formed of a single-crystal semiconductor having electrical conductivity. The base layer 12 may be a crystal semiconductor satisfying an $Al_xIn_yGa_{1-x-y}N$, where $0 \le x < 1$, $0 \le y < 1$, and $0 \le x+y < 1$.

The base layer 12 may be doped with an n-type impurity such as silicon (Si) to have a specific conductivity-type. The base layer 12 may include GaN having an n-type impurity concentration of $1 \times 10^{18}/cm^3$ or greater. A thickness of the base layer 12 provided for the growth of the nanocores 15a may be equal to or greater than 1 μm. In consideration of a follow-up electrode formation process, or the like, the thickness of the base layer 12 may range from 3 μm to 10 μm.

In a case in which a nitride semiconductor single crystal is grown as the base layer 12, the substrate 11 may be a GaN substrate formed of the same material as that of the base layer, or may be a sapphire substrate, a silicon (Si) substrate, or a silicon carbide (SiC) substrate, as a heterogeneous substrate formed of a material different to that of the base layer 11. A buffer layer (not shown) may be disposed between the substrate 11 and the base layer 12 as needed, to relieve a difference in lattice mismatches. The buffer layer (not shown) may be a layer of $Al_xIn_yGa_{1-x-y}N$ ($0 \le x \le 1$, $0 \le y \le 1$), or specifically, may be a GaN, AlN, AlGaN, InGaN or InGaAlN layer. In addition, the buffer layer may be used by combining a plurality of layers or by gradually changing a composition.

In a case in which the substrate 11 is a silicon substrate, the substrate may be warped or broken due to a difference in coefficients of thermal expansion between Gan and silicon, or the possibility of the occurrence of defects may be increased due to a constant difference. Therefore, in this case, since defect generation needs to be controlled while controlling stress to suppress warping, a buffer layer having a composite structure may be used. For example, on the substrate 11, a buffer layer may be formed using a crystal not including Ga, such as AlN or SiC, in order to prevent a reaction between Si and Ga. In particular, when a plurality of AlN layers are used, an AlGaN intermediate layer may be inserted therebetween to control stress therein.

The substrate 11 may be completely or partially removed or patterned during a chip manufacturing process to improve light emissions or electrical characteristics of an LED chip, before or after the growth of an LED structure.

For example, in the case of a sapphire substrate, laser rays are irradiated onto an interface with the substrate and the base layer 12 through the substrate 11 to thus separate the substrate therefrom, and a silicon or silicon carbide substrate may be removed through a grinding method, an etching method, or the like.

In the case that the substrate 11 is removed, another support substrate may be used. In the support substrate, a reflective metal may be attached thereto or a reflective structure may be added to a junction structure with the support substrate in order to improve light extraction efficiency of an LED chip.

When the substrate is patterned, concave-convex portions or an inclined surface may be formed on main surfaces (both side surfaces) of the substrate before or after the growth of a single crystal to thus improve light extraction efficiency and crystalline properties. The pattern may have a size ranging from 5 nm to 500 μm and may be a regular pattern or an irregular pattern. The pattern may be variously formed, for example, may have a pillar form, a peak-valley form, a semispherical form, or the like.

Figure 2:
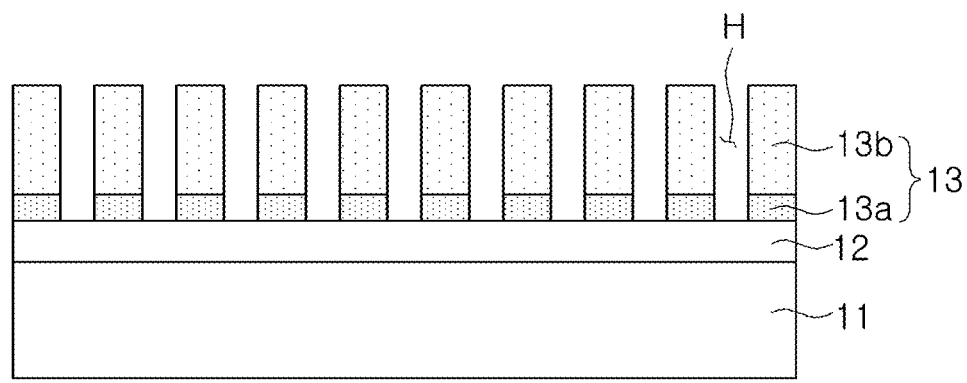

Subsequently, as illustrated in FIG. 2, a mask 13 having a plurality of openings H and an etch stop layer provided therein may be formed on the base layer 12.

The mask 13 according to the present exemplary embodiment may include a first material layer 13a formed on the base layer and a second material layer 13b formed on the first material layer 13a and having an etching rate greater than that of the first material layer 13a under etching conditions of the second material layer 13b.

The first material layer 13a may serve as the etch stop layer with respect to the second material layer 13b. That is, the first material layer 13a may have an etching rate lower than that of the second material layer 13b under the etching conditions for the second material layer 13b.

At least the first material layer 13a may be formed of a material having electrical insulation properties, and the second material layer 13b may also be formed of an insulating material as needed. The first and second material layers 13a and 13b may be formed of different materials to secure a desired difference in etching rates. For example, the first material layer 13a may be a SiN layer and the second material layer 13b may be a $SiO_2$ layer.

Such a difference in etching rates may be obtained using a difference in air gap densities. the second material layer 13b or both of the first and second material layers 13a and 13b may be formed of a material having a porous structure to secure a difference in etching rates between the first and second material layers 13a and 13b using a difference in porosity. In this case, the first and second material layers 13a and 13b may be formed of the same material. For example, the first material layer 13a may be formed of $SiO_2$ having a first porosity and the second material layer 13b may be formed of the same $SiO_2$ as that of the first material layer 13a, but the second material layer 13b may have a porosity greater than the first porosity. In this manner, under the conditions in which the second material layer 13b is etched, the first material layer 13a may be have an etching rate lower than that of the second material layer 13b.

The total thickness of the first and second material layers 13a and 13b may be set in consideration of a height of a necessary nanostructure. The first material layer 13a may have a thickness less than that of the second material layer 13b. An etch stop level through the first material layer 13a may be positioned at a depth equal to or below a point equal to ⅓ of the overall height of the mask 13. In other words, the first material layer 13a may have a thickness equal to or less than ⅓ of the total thickness of the first and second material layers 13a and 13b, or below.

The overall height of the mask 13, that is, the total thickness of the first and second material layers 13a and 13b may be about 1 μm or higher, and specifically, may range from about 5 to about 10 μm. The first material layer 13a may have a thickness of about 0.5 μm.

After the first and second material layers 13a and 13b are formed sequentially on the base layer 12, a plurality of openings H may be formed in the first and second materials layers to expose regions of the base layer 12 therethrough (FIG. 2). The size of respective openings H exposing the surface of the base layer 12 may be set in consideration of a necessary size of the light emitting nanostructure. For example, the openings H may have a width of about 300 nm or less, specifically, range from 50 to 500 nm.

The openings H of the mask 13 may be formed through a semiconductor process such as photolithography. For example, a deep-etching process to have a relatively high aspect ratio. The openings H may be implemented to have an aspect ratio of about 5:1 or higher, specifically, about 10:1 or higher.

In general, a dry etching process may be used as the deep-etching process, and reactive ions generated from plasma or ion beams generated in high vacuum may be used. Compared with wet etching, the deep-etching process allows for precision machining on a micro-structure without geometric constraints. A CF-based gas may be used for oxide film etching of the mask 13. For example, an etchant obtained by combining at least one of $O_2$ and Ar to a gas such as $CF_4$, $C_2F_6$, $C_3F_8$, $C_4F_8$, or $CHF_3$ may be used.

Figure 6:
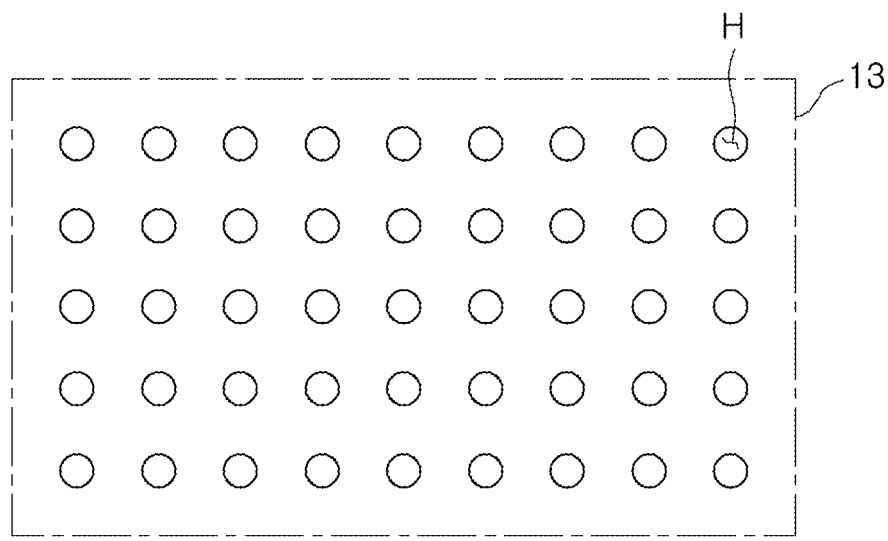
FIGS. 6 and 7 are plan views of masks illustrating shapes of openings as viewed from above, formed in the mask, according to exemplary embodiments.
Figure 7:
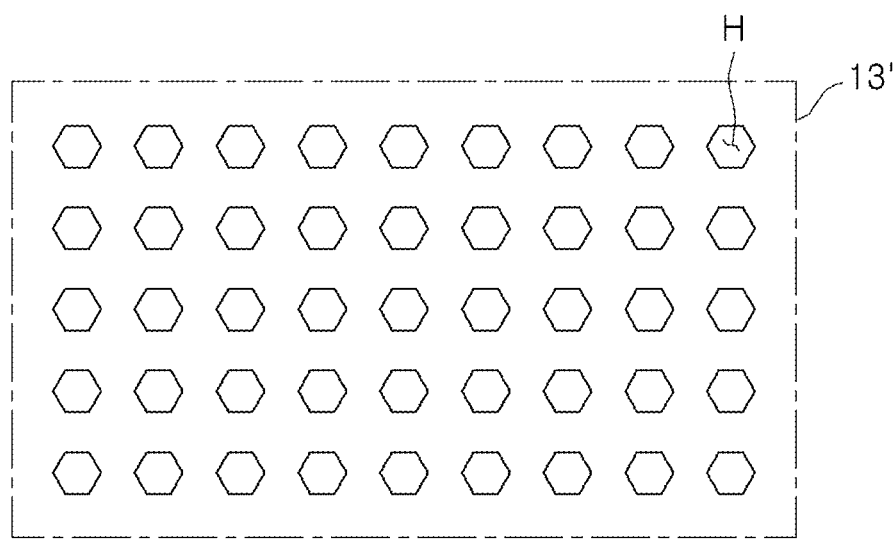

Shapes of the openings H and the alignment thereof may be variously implemented. For example, in the case of a planar shape, the openings H may have various shapes as viewed from above, such as a polygonal shape, a quadrangular shape, an elliptical shape or a circular shape. The mask 13 illustrated in FIG. 2 may have the openings H having a circular top-viewed shape aligned therein, as illustrated in FIG. 6, but may have different shapes and alignments as necessary. For example, as illustrated in a mask 13' of FIG. 7, openings having a regular hexagonal top-viewed shape may be aligned.

Although the case in which the openings H illustrated in FIG. 2 has a rod form is illustrated, the exemplary embodiment should not be considered to be limiting. The openings H may have various shapes using an appropriate etching process. The shape of the openings H may vary depending on etching conditions.

Figure 8:
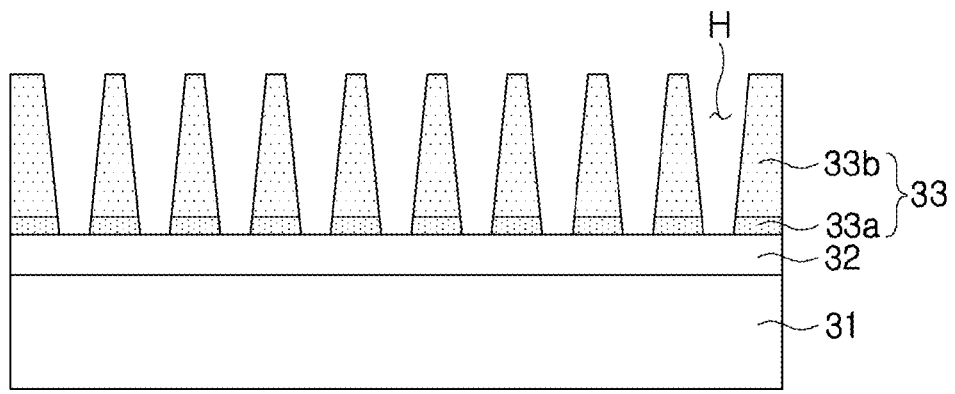
FIGS. 8 and 9 are side cross-sectional views illustrating openings formed in the mask according to exemplary embodiments.
Figure 9:
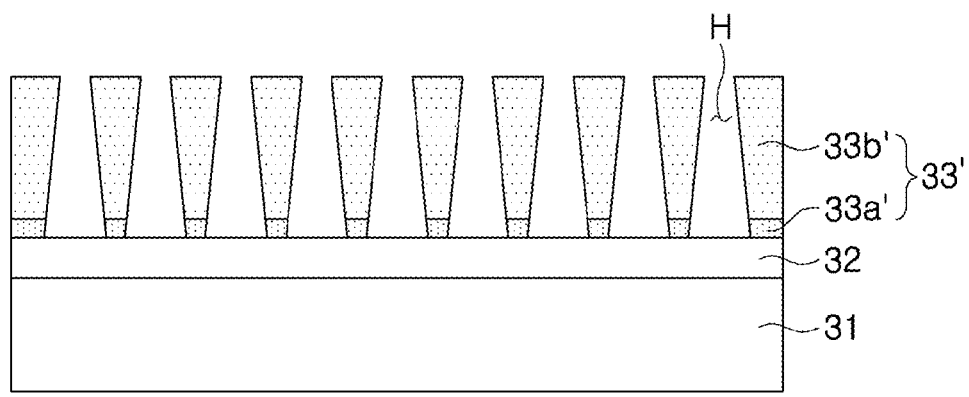

As such examples, FIGS. 8 and 9 illustrate different shaped openings formed in the mask. Referring to FIG. 8, a mask 33 including first and second material layers 33a and 33b has openings H having a pillar shape having a width gradually reduced downwardly. Unlike this, referring to FIG. 9, a mask 33' including first and second material layers 33a' and 33b' may have openings H having a pillar shape having a width gradually increased downwardly.

Figure 3:
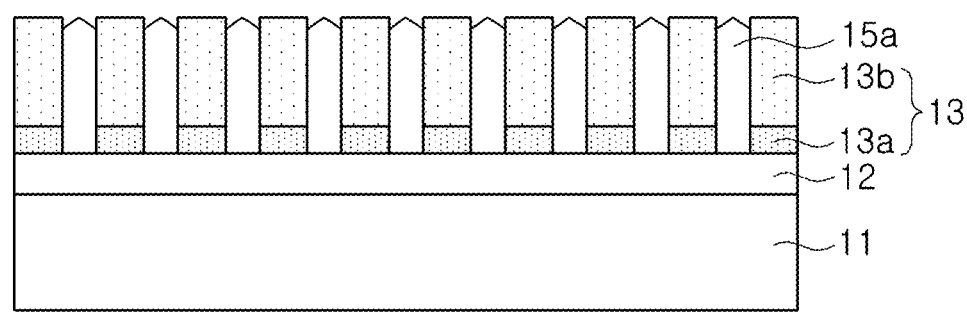

Subsequently, as illustrated in FIG. 3, a first conductivity-type semiconductor may be grown on the exposed regions of the base layer 12 such that the plurality of openings H are provided with the first conductivity-type semiconductor, thereby forming a plurality of nanocores 15a.

The first conductivity-type semiconductor of the nanocores 15a may be an n-type nitride semiconductor, for example, may be a crystal satisfying n-type $Al_xIn_yGa_{1-x-y}N$, where $0 \leq x<1$, $0 \leq y<1$, and $0 \leq x+y<1$. The first conductivity-type semiconductor configuring the nanocores may be formed of the same material as the first conductivity-type semiconductor of the base layer 12. For example, the base layer 12 and the nanocores 15a may be formed of n-type GaN.

A nitride single crystal configuring the nanocores 15a may be formed using metal organic chemical vapor deposition (MOCVD) or molecular beam epitaxy (MBE). The mask 13 may serve as a mold for a grown nitride single crystal to provide nanocores 15a having a form corresponding to that of the openings H. That is, the nitride single crystal may be selectively grown on regions of the base layer 12 exposed to the openings H using the mask 13 to fill the openings H. The nitride single crystal selectively grown on regions of the base layer 12 exposed to the openings H may have a form corresponding to that of the corresponding openings H.

Figure 4:
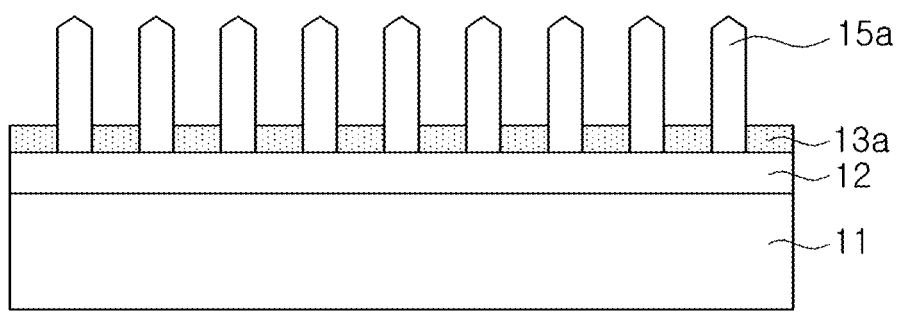

Next, as illustrated in FIG. 4, the mask 13 may be partially removed using the first material layer 13a as an etch stop layer such that side portions of the plurality of nanocores 15a are exposed.

In the present exemplary embodiment, the etching process in the conditions for selectively removing the second material layer 13b may be applied to thus only remove the second material layer 13b with the first material layer 13a remaining. In the present etching process, the first material layer 13a may be used as an etch stop layer, and in a subsequent process, the first material layer 13a may serve to prevent an active layer 15b and a second conductivity-type semiconductor layer 15c from contacting the base layer 12.

Figure 5:
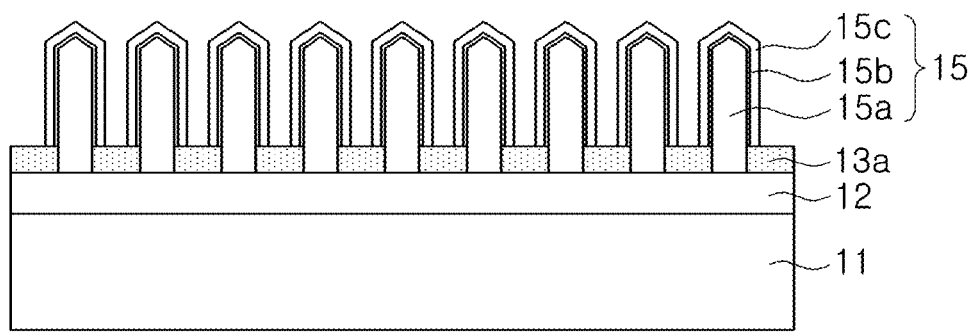

Then, as illustrated in FIG. 5, the active layer 15b and the second conductivity-type semiconductor layer 15c may be sequentially grown on the surfaces of the plurality of nanocores 15a.

Through the processes described above, the light emitting nanostructure 15 may have a core-shell structure in which the first conductivity-type semiconductor is provided as the nanocores 15a, and the active layer 15b and the second conductivity-type semiconductor layer 15c surrounding the nanocore 15a are provided as shell layers.

The active layer 15b may have a multiple quantum well (MQW) structure in which quantum well layers and quantum barrier layers are alternately stacked on top of each other, and for example, may have a GaN/InGaN structure in the case of a nitride semiconductor. Here, a single quantum well (SQW) structure may also be used.

The second conductivity-type semiconductor layer 15c may be a crystal satisfying p-type $Al_xIn_yGa_{1-x-y}N$, where $0 \leq x<1$, $0 \leq y<1$, and $0 \leq x+y<1$. The second conductivity-type semiconductor layer 15c may further include an electron stopping layer (not shown) on a portion thereof adjacent to the active layer 15b. The electron stopping layer (not shown) may have a structure in which a plurality of different compositional $Al_xIn_yGa_{1-x-y}N$ layers, where $0 \leq x<1$, $0 \leq y<1$, and $0 \leq x+y<1$, are stacked or may have at least one or more layers configured of $Al_yGa_{(1-y)}N$, where $0 \leq y<1$. The electron stopping layer (not shown) may have a bandgap greater than that of the active layer 15b to thus prevent electrons from flowing to the second conductive (p-type) semiconductor layer 15c.

As such, although the present exemplary embodiment illustrates the case in which the light emitting nanostructure 15 has a core-shell structure and a rod form, the exemplary embodiments should not be considered to be limiting. That is, the light emitting nanostructure 15 may be variously formed, for example, may have a pyramid form or a form in which pyramid and rod forms are combined.

In a process of manufacturing a light emitting nanostructure using a mask having openings formed therein as a mold, an additional heat treatment to improve crystalline properties may be introduced.

After removing the mask, a nanocore surface may be subjected to a heat treatment in a predetermined condition such that a nanocore crystal plane may be changed to a stabilized plane suitable for crystal growth, such as a semipolar or non-polar crystal plane. Such a process may be explained with reference to FIGS. 6A and 6B.

The nanostructure semiconductor light emitting device illustrated in FIG. 5 may include an electrode formed in various manners. FIGS. 10 to 14 are cross-sectional views illustrating examples of main processes of forming an electrode.

Figure 10:
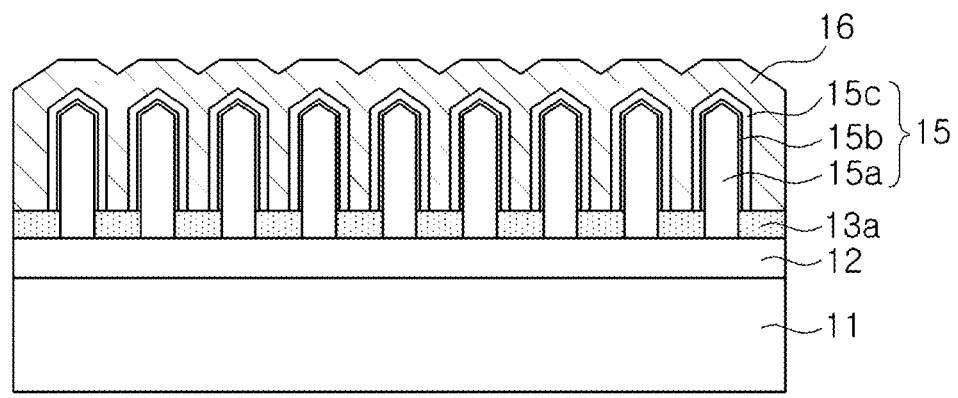
FIGS. 10 to 14 are cross-sectional views illustrating examples of main processes of forming an electrode applied to a nanostructure semiconductor light emitting device provided in a process of FIG. 5.

First, as illustrated in FIG. 10, a contact electrode layer 16 may be formed on the light emitting nanostructure 15 provided in the process of FIG. 1E.

The contact electrode layer 16 may be obtained by forming a seed layer on the surface of the light emitting nanostructure 15 and then performing electroplating thereon. This seed layer may be formed of a material suitable for ohmic contact with the second conductivity-type semiconductor layer 15c. As a material for the ohmic contact, GaN, InGaN, ZnO, or graphene may be used. The contact electrode layer 16 may include a material such as a graphene layer, Ag, Ni, Al, Rh, Pd, Ir, Ru, Mg, Zn, Pt, Au, or the like and may have a structure of two or more layers, for example, a layer structure of Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like. For example, after forming an Ag/Ni/Cr layer as a seed layer using a sputtering method, Cu/Ni may be formed using electroplating to thus form a desired contact electrode layer 16.

The contact electrode layer 16 used in the present exemplary embodiment includes a reflective metal layer, from which it can be understood that light is extracted toward the substrate, but the exemplary embodiment should not be considered to be limiting. The contact electrode layer 16 may be formed employing a transparent material such as ZnO, graphene, indium tin oxide (ITO) such that light may also be extracted to the light emitting nanostructure 15.

Although not employed in the present exemplary embodiment, in a case in which the surface having the contact electrode layer 16 formed thereon is not uniform, the electrode upper surface may be planarized using a planarizing process, such as a CMP (chemical mechanical polishing).

Figure 11:
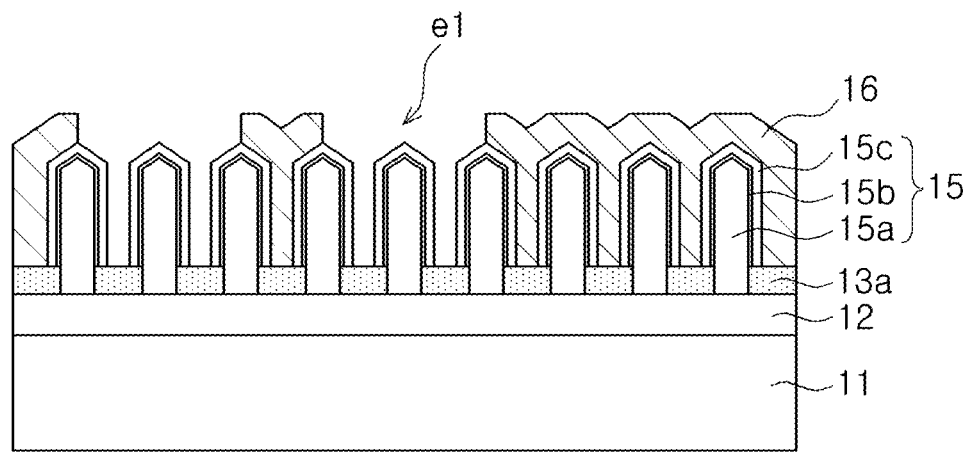
Figure 12:
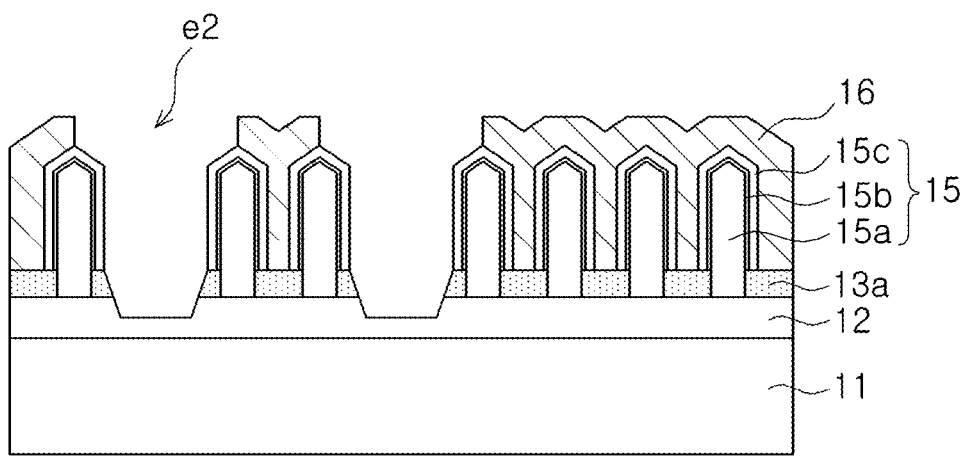

Then, as illustrated in FIG. 11, the light emitting nanostructure 15 may be exposed by selectively removing an electrode region e1 positioned in a region in which another electrode is to be formed, and next, as illustrated in FIG. 12, a portion e2 of the base layer 12 may be exposed by selectively removing the exposed light emitting nanostructure 15.

The process illustrated in FIG. 11 is a process of etching an electrode material such as a metal, and the process illustrated in FIG. 12 is a process of etching a semiconductor material. These etching processes may be performed under conditions different to each other.

Figure 13:
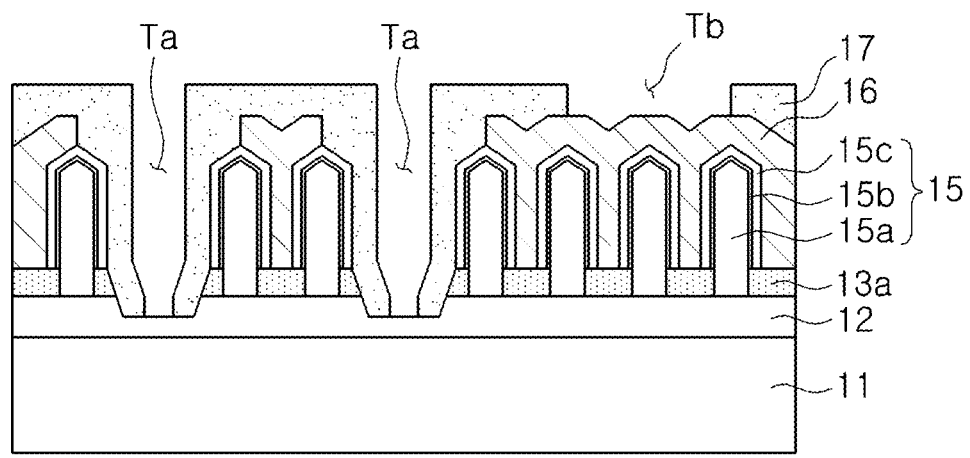

Subsequently, as illustrated in FIG. 13, an insulating film 17 may be formed such that contact regions Ta of electrodes and Tb are exposed. A portion of the base layer 12 is provided in the contact region Ta of a first electrode, and a portion of the contact electrode layer 16 may be provided in a contact region Tb of a second electrode.

Figure 14:
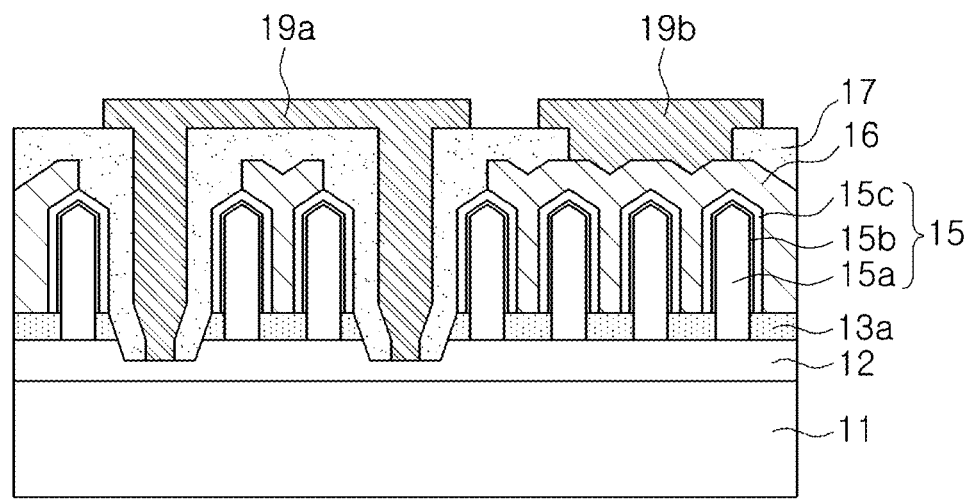

Thereafter, as illustrated in FIG. 14, first and second electrodes 19a and 19b may be formed to be connected to the contact regions Ta and Tb. An electrode material used in the present process may be formed of a common electrode material of the first and second electrodes 19a and 19b. For example, a material for the first and second electrodes 19a and 19b may be Au, Ag, Al, Ti, W, Cu, Sn, Ni, Pt, Cr, NiSn, TiW, AuSn, or eutectic metals thereof.

The manufacturing method according to the exemplary embodiment of the present inventive concept may be variously modified. FIGS. 15 through 21 are cross-sectional views illustrating respective main processes in a method of manufacturing a nanostructure semiconductor light emitting device according to another exemplary embodiment of the present inventive concept.

Figure 15:
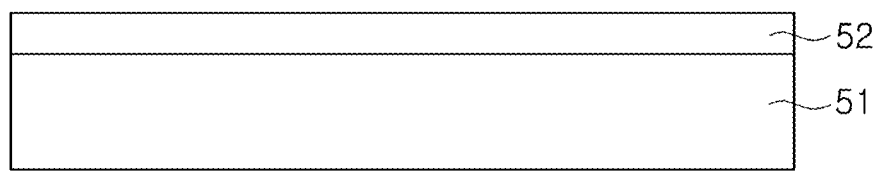
FIGS. 15 through 21 are cross-sectional views illustrating respective main processes of a method of manufacturing a nanostructure semiconductor light emitting device according to an exemplary embodiment of the inventive concept.

As illustrated in FIG. 15, a base layer 52 may be provided by growth of a first conductivity-type semiconductor on a substrate 51.

The base layer 52 may provide a crystal growth surface for growth of light emitting nanostructures thereon and may be used to electrically connect light emitting nanostructures 55 to each other. Therefore, the base layer 52 may be formed of a single-crystal semiconductor having electrical conductivity. In a case in which the base layer 52 is directly grown, the substrate 51 may be a crystal growth substrate.

The base layer 52 may be a nitride semiconductor satisfying $Al_xIn_yGa_{1-x-y}N$ where $0 \leq x < 1$, $0 \leq y < 1$, $0 \leq x+y < 1$, and may be doped with n-type impurities such as silicon (Si). In this case, the substrate 51 may be formed of sapphire, SiC, Si, $MgAl_2O_4$, MgO, $LiAlO_2$, $LiGaO_2$, or GaN.

Figure 16:
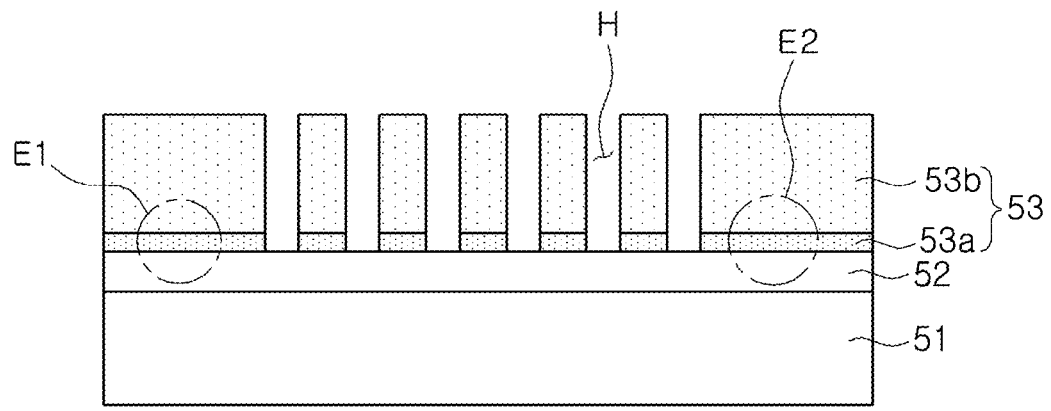

Next, as illustrated in FIG. 16, a mask 53 having a plurality of openings H and an etch-stop layer interposed therein may be formed on the base layer 52.

Similarly to the former exemplary embodiment, the mask 53 according to the present exemplary embodiment may include a first material layer 53a formed on the base layer 52, and a second material layer 53b formed on the first material layer 53a and having an etching rate greater than that of the first material layer 53a. The first material layer 53a may be provided as the etch-stop layer.

The first and second material layers 53a and 53b may be formed of different materials to obtain a required difference in etching rates. For example, the first material layer 53a may be a SiN layer and the second material layer 53b may be a $SiO_2$ layer. Unlike this, the second material layer 53b or both of the first and second material layers 53a and 53b may be formed of a material having a porous structure to secure a difference in etching rates using a difference in porosity. In this case, the first and second material layers 53a and 53b may be formed of the same material.

After the first and second material layers 53a and 53b are formed sequentially on the base layer 52, a plurality of openings H may be formed in the first and second material layers to expose regions of the base layer 52 therethrough. The size of each openings H exposing the surface of the base layer 53 may be set in consideration of a desired size of the light emitting nanostructure. For example, the openings H may have a width (diameter) of 600 nm or less, specifically, range from 50 to 500 nm.

The regions in which the openings H are formed are regions in which nanocores, i.e., light emitting nanostructures, are to be grown, and thus, regions E1 and E2 in which electrodes are to be formed may be set in advance and the openings H may not be formed in the regions E1 and E2. In this case, a process of removing light emitting nanostructures may be omitted in a follow-up electrode formation process.

The openings H of the mask 53 may be formed through a semiconductor process such as photolithography, for example, a deep-etching process, to have a relatively high aspect ratio. The openings H may be implemented to have an aspect ratio of 5:1 or higher, specifically, 10:1 or higher. While varied depending on etch conditions, in general, the openings H in the first and second material layers 53a and 53b may have a width decreased in a direction toward the base layer (please refer to experimental examples and FIG. 44 below).

Figure 17:
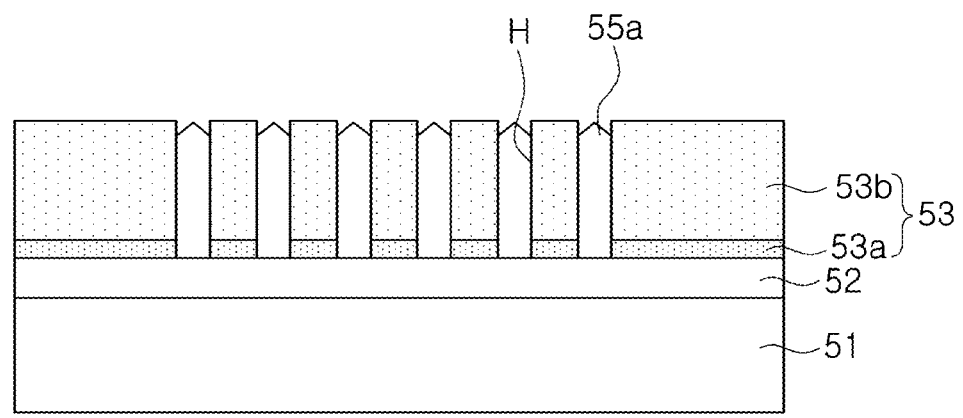

Next, as illustrated in FIG. 17, a first conductivity-type semiconductor is grown on the exposed regions of the base layer 52 such that the plurality of openings H are filled with the first conductivity-type semiconductor, thereby forming a plurality of nanocores 55a.

The first conductivity-type semiconductor of the nanocores 55a may be an n-type nitride semiconductor, for example, may be a crystal satisfying n-type $Al_xIn_yGa_{1-x-y}N$, where $0 \leq x < 1$, $0 \leq y < 1$, $0 \leq x+y < 1$. The first conductivity-type semiconductor configuring the nanocores may be formed of the same material as the first conductivity-type semiconductor of the base layer 52. For example, the base layer 52 and the nanocores 55a may be formed of n-type GaN.

A nitride single crystal configuring the nanocores 55a may be formed using metal organic chemical vapor deposition (MOCVD) or molecular beam epitaxy (MBE). The mask 53 may serve as a mold for a grown nitride single crystal to provide the nanocores 55a having shapes corresponding to those of the openings. That is, the nitride single crystal may be selectively grown on regions of the base layer 52 exposed to the openings H using the mask 53 to fill the openings H therewith. The nitride single crystal selectively grown on regions of the base layer 52 exposed to the openings H may have a form corresponding to those of the openings H.

Figure 18:
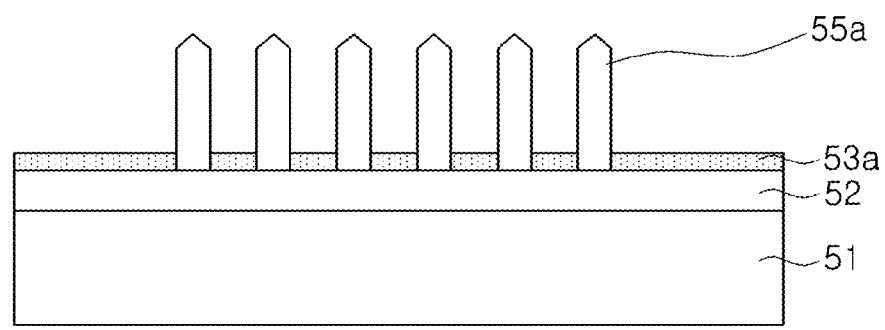

Next, as illustrated in FIG. 18, the mask 53 may be partially removed using the first material layer 53a as an etch-stop layer such that side surfaces of the plurality of nanocores 55a are exposed.

In the present exemplary embodiment, an etching process may be performed in such a manner that only the second material layer 53b is selectively etched, whereby only the second material layer 53b is removed while the first material layer 53a remains. In the present etching process, the first material layer 53a may be used as the etch-stop layer, and in a subsequent process, the first material layer 53a may prevent an active layer 55b and a second conductivity-type semiconductor layer 55c from contacting the base layer 52.

Figure 19:
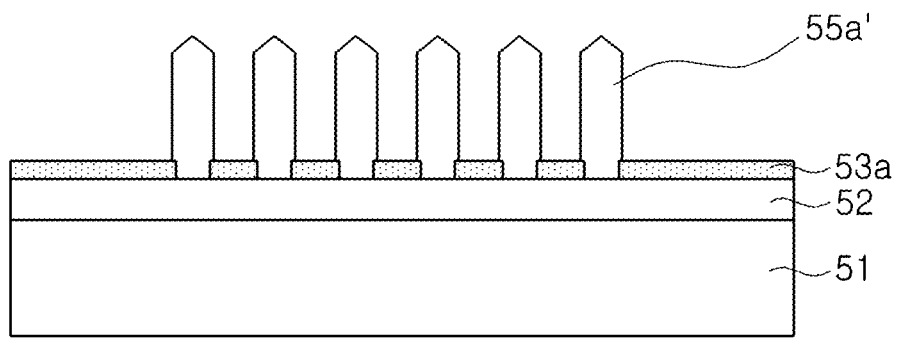

As in the present exemplary embodiment, in the process of manufacturing light emitting nanostructures using a mask provided with openings as a mold, a heat treatment process may be further included to improve crystalline properties. FIG. 19 illustrates a nanocore 55' that has been heat-treated to have improved crystalline properties.

After removing the mask (the second material layer 53b), a surface of the nanocore 55a may be subjected to a heat treatment in a predetermined condition such that a crystal plane of the nanocore 55a may be changed to a stable surface suitable for crystal growth, such as a semipolar or non-polar crystal plane. Such a process may be explained with reference to FIGS. 23 and 24.

Figure 22:
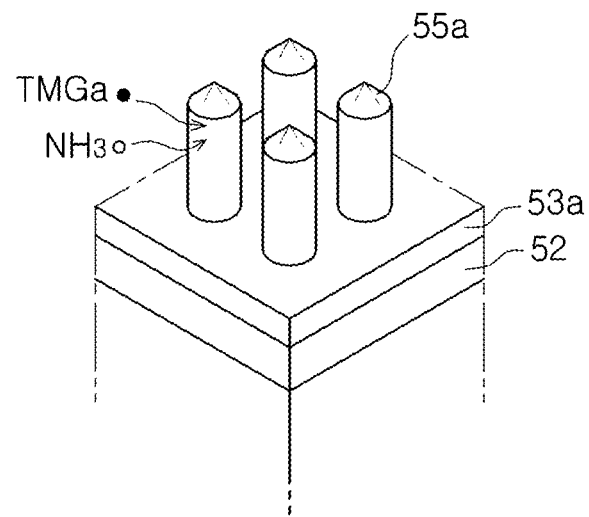
FIGS. 22 and 23 are schematic views illustrating a heat treatment process applicable to the processes of in FIGS. 18 and 19.
Figure 23:
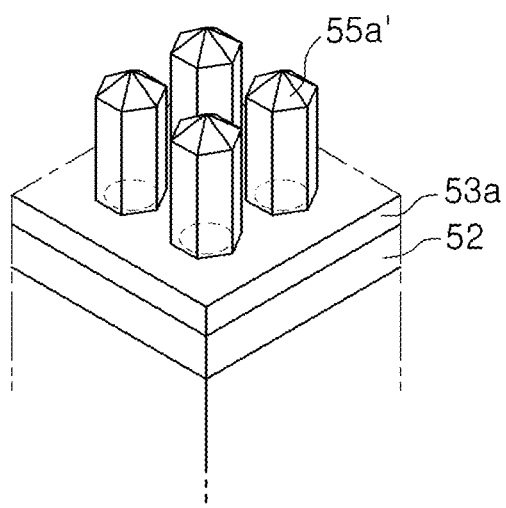

FIGS. 22 and 23 are mimetic diagrams respectively illustrating heat treatment processes applied to the embodiment of FIG. 18.

FIG. 22 may illustrate nanocores 55a obtained in the process of FIG. 18. Each of the nanocores may have crystal planes determined depending on a cross-sectional shape of an opening. Although the obtained nanocore 55a has crystal planes determined depending on a cross-sectional shape of the openings H, the crystal planes of the nanocore 55a provided as described above may be relatively unstable, which may be a factor deteriorating subsequent crystal growth conditions.

As in the present exemplary embodiment, in a case in which the openings have a cylindrical rod shape, a side surface of the nanocore 55a may have a curved surface rather than a specific crystal plane as illustrated in FIG. 22.

Figure 24:
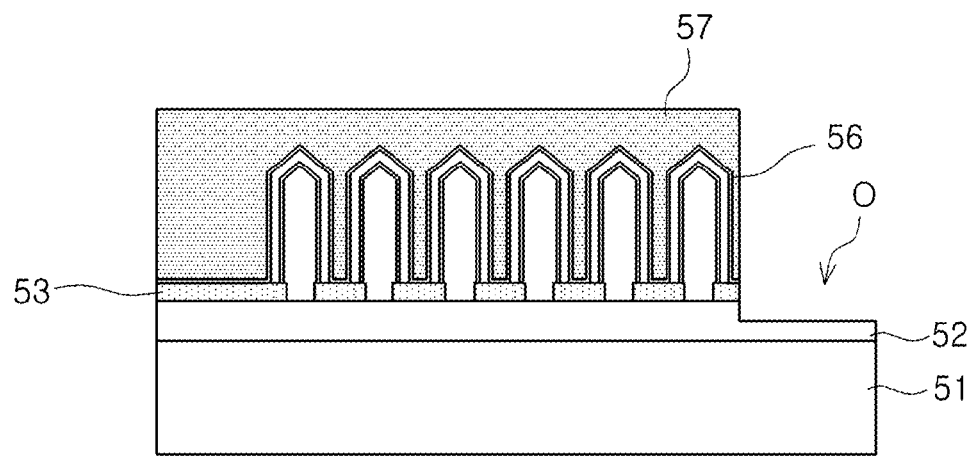
FIGS. 24 through 27 are cross-sectional views illustrating an example of an electrode formation process regarding the resultant product illustrated in FIG. 21.

When this nanocore is subjected to a heat treatment, unstable crystals on the surface thereof may be realigned, such that a stable crystal plane in semipolarity or non-polarity may be formed as illustrated in FIG. 24. The heat treatment may be performed at a temperature of 600° C. or higher, or at a temperature ranging from 800° C. to 1200° C. in a specific example, for a few seconds to tens of minutes (1 second to 60 minutes), thereby converting an unstable crystal plane into a stable crystal plane.

In the heat treatment process, if the substrate temperature is lower than 600° C., it is difficult to grow and rearrange crystals of the nanocores, making it difficult to obtain a heat treatment effect, and if the substrate temperature is lower than 1200° C., nitrogen (N) is evaporated from the GaN crystal planes to degrade crystal quality. Also, for a period of time shorter than 1 second, it is difficult to obtain a sufficient heat treatment effect, and a heat treatment performed for tens of minutes, for example, for a period of time longer than 60 minutes, is not desirable in terms of a manufacturing process and manufacturing costs.

For example, when the nanocore 55 is grown using a C (0001) plane of the sapphire substrate ((111) plane in case of a silicon substrate), a nanocore 55a having a cylindrical shape illustrated in FIG. 23 may be heat-treated in an appropriate temperature range as mentioned above to convert a curved surface (side surface), an unstable crystal plane, into hexagonal crystal column (55a' in FIG. 23) having a non-polar surface (m plane) as a stable crystal plane. Stabilization of the crystal plane may be realized through the heat treatment process performed at a high temperature.

Although it is difficult to clearly explain such a principle, in a case in which crystals positioned on the surface at a relatively high temperature are realigned or a source gas remains in a chamber, it can be understand that partial re-growth is performed to have a stable crystal plane through deposition of the remaining source gas.

In particular, in view of re-growth, a heat treatment process may be performed in an atmosphere in which source gas remains in a chamber, or a heat treatment may be performed in a condition of intentionally supplying a relatively small amount of source gas. For example, as illustrated in FIG. 22, in the case of an MOCVD chamber, TMGa and $NH_3$ remain, and in this residual atmosphere, the heat treatment is performed such that source gas reacts with a nanocore surface to thus realize partial re-growth so as to have a stable crystal plane. Due to this regrowth, widths of the heat-treated nanocores 55a' may be slightly increased, relative to those of the nanocores 55a prior to the heat treatment process (please refer to FIGS. 22 and 23).

In this manner, crystallinity of the nanocores may be enhanced by introducing the additional heat treatment process. Namely, through the heat treatment process, non-uniformity (for example, a defect, or the like) present on the surfaces of nanocores after the removal of the mask may be removed and stability of the internal crystals may be greatly enhanced through rearrangement. The heat-treatment process may be performed under conditions similar to those of the growth process of the nanocores within a chamber after the removal of the mask. For example, the heat treatment process may be performed at a temperature (for example, a substrate temperature) ranging from 800° C. to 1200° C., but a similar effect may also be obtained even with a heat treatment process performed at a temperature equal to or higher than 600° C.

Figure 20:
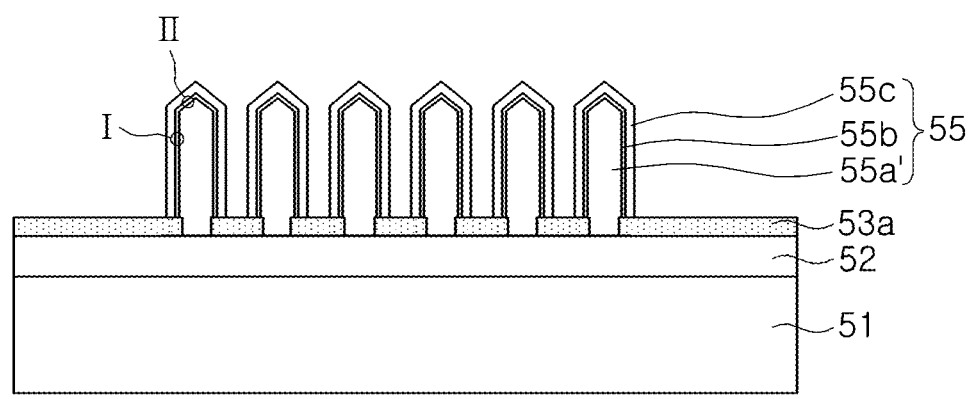

Next, as illustrated in FIG. 20, the active layer 55b and the second conductivity-type semiconductor layer 55c may be sequentially grown on surfaces of the plurality of nanocores 55a'.

Through the process as described above, light emitting nanostructures 55 may have a core-shell structure in which the first conductivity-type semiconductor is provided as the nanocores 55a', and the active layer 55b and the second conductivity-type semiconductor layer 55c surrounding the respective nanocores 55a' are provided as shell layers.

The active layer 55b may have a multiple quantum well (MQW) structure in which quantum well layers and quantum barrier layers are alternately stacked, for example, may have an GaN/InGaN or GaN/AlGaN structure in the case of a nitride semiconductor. Here, the active layer 55b may also have a single quantum well (SQW) structure.

The second conductivity-type semiconductor layer 55c may be a crystal satisfying p-type $Al_xIn_yGa_{1-x-y}N$, where $0 \le x<1$, $0 \le y<1$, and $0 \le x+y<1$. The second conductivity-type semiconductor layer 55c may include an electron blocking layer (not shown) in a portion thereof adjacent to the active layer 55b. The electron blocking layer (not shown) may have a multilayer structure in which a plurality of layers having different compositions of $Al_xIn_yGa_{1-x-y}N$, where $0 \le x<1$, $0 \le y<1$, $0 \le x+y<1$, are stacked or may have at least one layer configured of $Al_yGa_{(1-y)}N$, where $0 \le y<1$. The electron blocking layer (not shown) may have a greater band gap than that of the active layer 55b to thus prevent electrons from flowing to the second conductivity-type (p-type) semiconductor layer 55c.

Each of the nanocores 55a' may include a main part providing a side surface having a first crystal plane in a growth direction and an upper part providing an upper surface having a second crystal plane different to the first crystal plane.

When the base layer 52 is a nitride single crystal including an upper surface having a c-plane, the side surface of the main part may have a crystal plane perpendicular to the growth surface of the base layer 52, that is, a non-polar m-plane, and the surface of the upper part may have a semipolar r-plane different to the m-plane. In this manner, the surfaces of the nanocore 55a may have a plurality of different crystal planes.

Thus, as described above, even in the case in which the active layer 55b is grown on the surfaces of the nanocore 55a' through the same process, a composition (in particular, the content of indium) of the active layer 55b may be different according to respective crystal planes. Also, the active layer portion formed in the upper part may be relatively thin.

Figure 21:
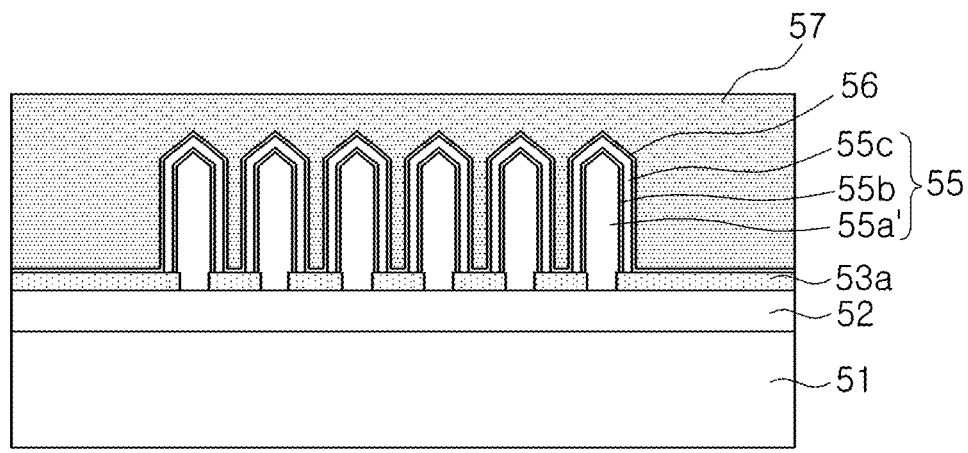

Thereafter, as illustrated in FIG. 21, a contact electrode 56 is formed on the light emitting nanostructures 55. Additionally, a protective insulating layer 57 may be formed on the contact electrode 56.

The contact electrode 56 may be formed of a material forming ohmic-contact with the second conductivity-type semiconductor layer 55c. For example, the contact electrode 56 may include at least one of Ag, Ni, Al, Rh, Pd, Ir, Ru, Mg, Zn, Pt, and Au, and may be provided as a monolayer or a plurality of layers. In addition to these electrode materials, the contact electrode 56 may also be formed of a transparent electrode material such as ITO, and ZnO or graphene may also be used as necessary.

The protective insulating layer 57 may be formed of an electrically insulating material able to provide a passivation structure through a semiconductor process. A protective insulating layer formed of $SiO_2$ or $SiN_x$ may be used as the protective insulating layer 57. In detail, the protective insulating layer 57 may be formed of tetraethylorthosilane (TEOS), borophosphor silicate glass (BPSG), CVD-$SiO_2$, spin-on glass (SOG), or a spin-on dielectric (SOD) material in order to easily fill the spaces between the light emitting nanostructures 55.

In this exemplary embodiment, it is illustrated that the contact electrode 56 is provided as a thin layer along the surface of the light emitting nanostructures 56 and the protective insulating layer 57 acting as a passivation layer fills the spaces between the light emitting nanostructures 55, but alternatively, like the structure illustrated in FIG. 10, the contact electrode may also be formed as a thick film to fill the spaces between the light emitting nanostructures 55.

It is described that the heat treatment process introduced in the aforementioned exemplary embodiment is performed after the mask 53 is removed. However, the heat treatment process may also be applied during the growth process of the nanocores 55a before the removal of the mask, or before the removal of the mask after the completion of the growth of the nanocores 55a.

The heat treatment process introduced before the removal of the mask may be performed under conditions similar to the growth temperature, and may obtain a sufficient effect even with a period of time shorter than the heat treatment process performed before the removal of the mask. The heat treatment process performed before the removal of the mask may be understood as improving crystallinity of the nanocores in terms of rearrangement of crystal. This will be described in detail with reference to the exemplary embodiment hereinafter.

In the nanostructure semiconductor light emitting device of FIG. 21, an electrode may be formed to have various structures. FIGS. 24 through 27 are cross-sectional views illustrating respective main processes in an example of an electrode formation process.

As illustrated in FIG. 24, the protective insulating layer 57 may be selectively removed to expose a portion O of the base layer 52.

The exposed region O of the base layer 52 may provide a region in which a first electrode is to be formed. The present removing process may be performed through an etching process such as a photolithography process. In a case in which the light emitting nanostructure 55 is positioned in the region O to be etched, a process of removing the corresponding light emitting nanostructure may be required. Here, however, as illustrated in FIG. 16, since nanocores 55a are not grown in the regions e1 and e2 in which electrodes are to be formed, there is no light emitting nanostructure 55 to be removed in this process.

In a specific example, a portion of the light emitting nanostructures 25 positioned in the desired exposed region e1 may be removed, but the nanocore 25a may not be grown in the region in which an electrode is to be formed, such that the light emitting nanostructure 25 removed during the present process is not present (please refer to FIG. 15).

Figure 25:
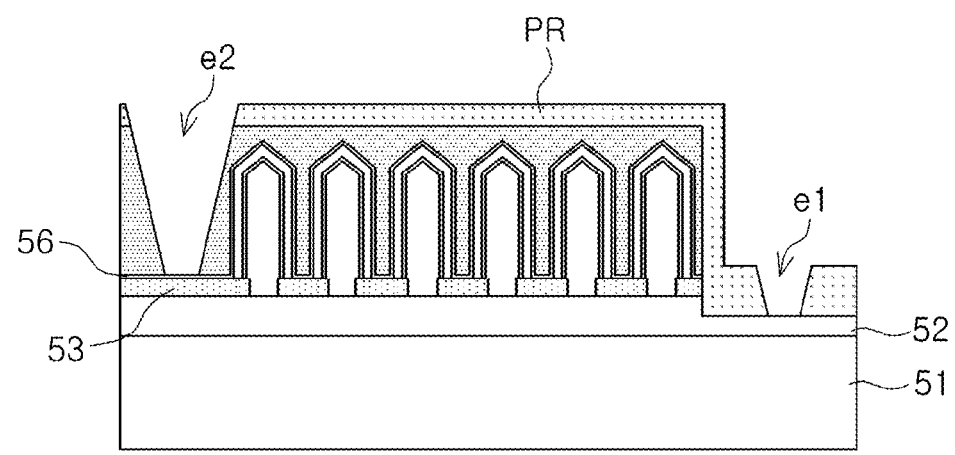

Thereafter, as illustrated in FIG. 25, photoresist PR having the first and second openings e1 and e2 may be formed.

The first and second openings e1 and e2 may define first and second electrode formation regions. During the present process, the first opening e1 may expose a portion of the base layer 52 and the second opening e2 may expose a portion of the contact electrode 56.

Figure 26:
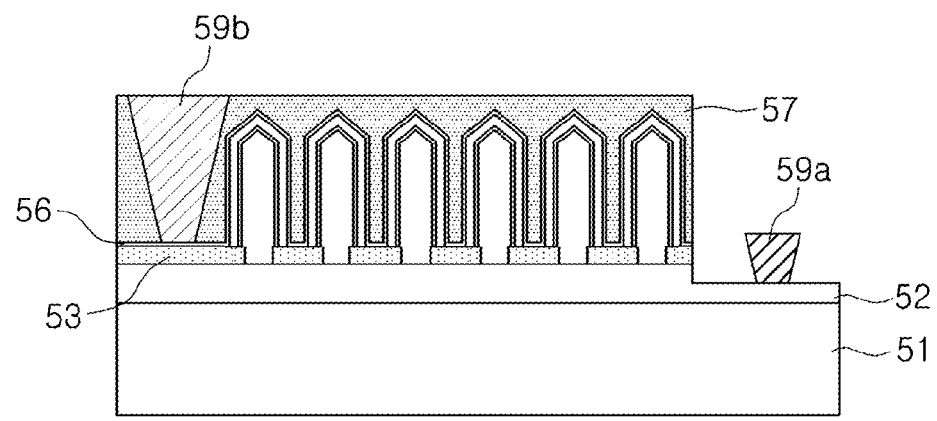

Thereafter, as illustrated in FIG. 26, first and second electrodes 59a and 59b may be formed in the first and second openings e1 and e2, respectively. As an electrode material used in the present process, a common electrode material of the first and second electrodes 59a and 59b may be used. For example, a material for the first and second electrodes 59a and 59b may include Au, Ag, Al, Ti, W, Cu, Sn, Ni, Pt, Cr, NiSn, TiW, AuSn or eutectic metals thereof.

Figure 27:
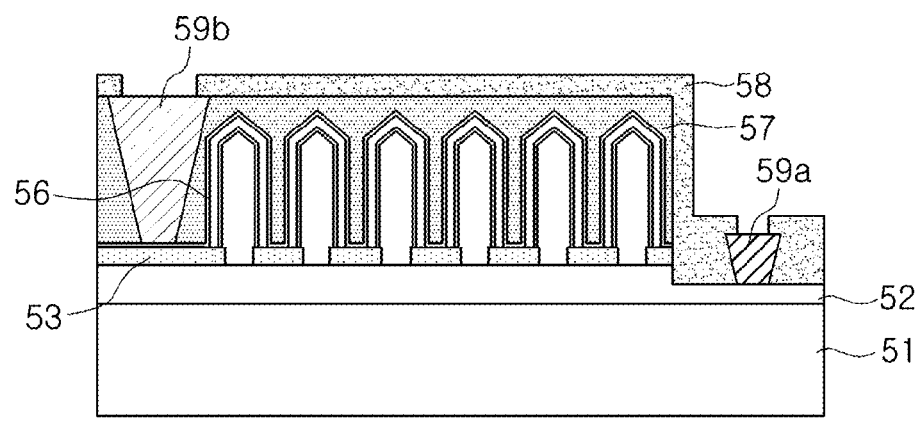

Thereafter, as illustrated in FIG. 27, a passivation layer 58 may be formed additionally. The passivation layer 58 may be formed as a protective layer covering the light emitting nanostructures together with the protective insulating layer 57. The passivation layer 58 may firmly maintain the first and second electrodes 59a and 59b, as well as covering to protect the exposed semiconductor region. The passivation layer 58 may be formed of a material the same as or similar to the material used for the protective insulating layer 27.

The above-mentioned present exemplary embodiment provides the case in which the mask is configured of two material layers, but the exemplary embodiment should not be considered to be limiting. That is, three or more material layers may be employed.

FIGS. 28 through 31 are cross-sectional views illustrating respective main processes of a method of manufacturing a nanostructure semiconductor light emitting device according to another exemplary embodiment (a change in a mask structure) of the inventive concept.

Figure 28:
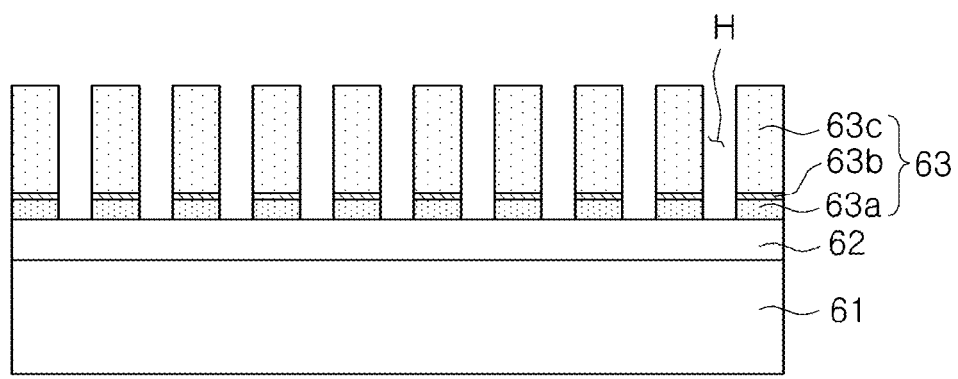
FIGS. 28 through 31 are cross-sectional views illustrating respective main processes of a method of manufacturing a nanostructure semiconductor light emitting device according to another exemplary embodiment (a change in a mask structure) of the inventive concept.

As illustrated in FIG. 28, a base layer 62 may be provided on a substrate 61, and on the base layer 62, a mask 63 having a plurality of openings H formed therein and an etch stop layer 63b interposed therein may be formed.

The mask 63 employed in the present exemplary embodiment may include first to third material layers 63a, 63b and 63c formed sequentially on the base layer 62. The second material layer 63b may be provided as the etch stop layer and may be formed of a material different to those of the first and third material layers 63a and 63c. The first and third material layers 63a and 63c may be formed of the same material as needed.

Under the etching conditions of the third material layer 63c, at least the second material layer 63b has an etching rate lower than that of the third material layer 63c, and thus, the second material layer 63b may serve as an etch stop layer. At least the first material layer 63a may be formed of a material having electrical insulation properties, and the second or third material layer 63b or 63c may be formed of an insulating material as necessary.

The first to third material layers 63a, 63b and 63c may be formed of different materials from one another to obtain a necessary difference in etching rates. For example, the second material layer 63b may be a layer of SiN, and the first and third material layers 63a and 63c may be layers of $SiO_2$. Unlike the description above, such a difference in etching rates may be realized using pore density. In this case, the second and third material layers 63b and 63c may be formed of the same material but the material may have different pore densities.

A total thickness of the first to third material layers 63a, 63b and 63c may be set in consideration of a height of a light emitting nanostructure. The first and second material layers 63a and 63b may have a thickness less than that of the third material layer 63c. An etch stop level through the second material layer 63b may be positioned at a depth equal to or below a point equal to ⅓ of the overall height of the mask 63, that is, at a position at a depth equal to or below a point equal to ⅓ of the total thickness of the first to third material layers 63a, 63b and 63c, or below, from the surface of the base layer 62.

The overall height of the mask 63, that is, the total thickness of the first to third material layers 63a, 63b and 63c may be 1 μm or higher, specifically, may range from 5 to 10 μm. The first and second material layers 63a and 63b may have a thickness of 0.5 μm or less.

The first to third material layers 63a, 63b and 63c may be formed sequentially on the base layer 62, and a plurality of openings H may then be formed therein through a photolithography process using a photoresist (PR) to expose regions of the base layer 62 (FIG. 28). The size of respective openings H may be set in consideration of a size of a necessary light emitting nanostructure. For example, the opening may have a width of about 600 nm or less, specifically, range from 50 to 500 nm.

The openings H may be formed using a semiconductor process such as photolithography. For example, the openings H having a relatively high aspect ratio using a deep etching process may be formed. An aspect ratio of the openings H may be implemented to be about 5:1 or higher, specifically, about 10:1 or higher.

Figure 29:
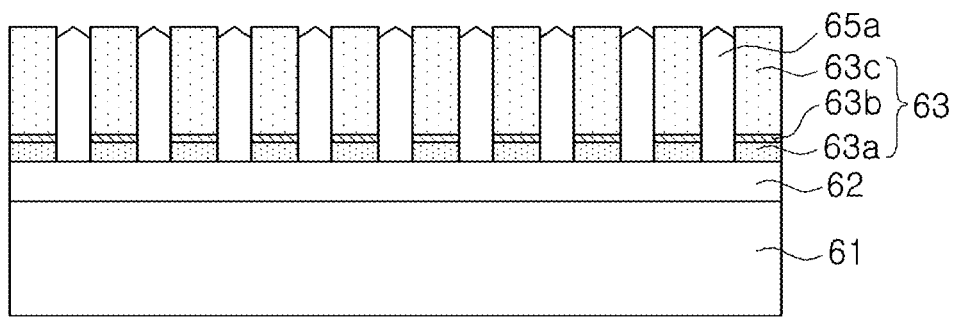

Subsequently, as illustrated in FIG. 29, a first conductivity-type semiconductor may be grown on the exposed regions of the base layer 12 such that the plurality of openings H are provided with the first conductivity-type semiconductor, thereby forming a plurality of nanocores 65a.

The first conductivity-type semiconductor of the nanocores 65a may be an n-type nitride semiconductor, for example, may be a crystal satisfying n-type $Al_xIn_yGa_{1-x-y}N$, where $0 \le x < 1$, $0 \le y < 1$, and $0 \le x+y < 1$. The first conductivity-type semiconductor configuring the nanocores 65a may be formed of the same material as the first conductivity-type semiconductor of the base layer 62. For example, the base layer 62 and the nanocores 65a may be formed of n-type GaN.

A nitride single crystal configuring the nanocores 65a may be formed using an MOCVD process or an MBE process. The mask 63 may serve as a mold for a grown nitride single crystal to provide nanocores 65a having a form corresponding to that of the opening. That is, the nitride single crystal may be selectively grown on regions of the base layer 62 exposed to the openings H using the mask 63 to fill the openings H. The nitride single crystal selectively grown on regions of the base layer 62 exposed to the openings H may have a form corresponding to that of the corresponding openings H.

Figure 30:
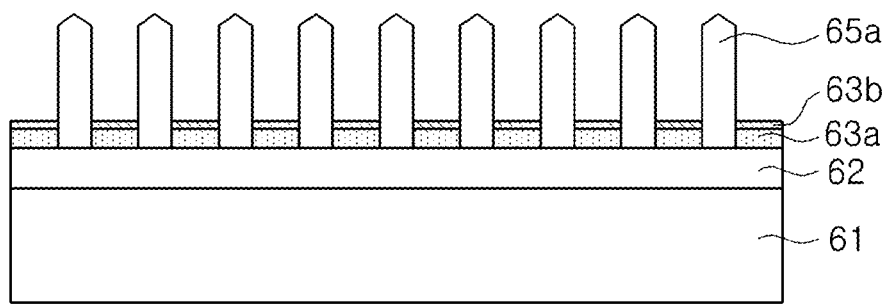

Next, as illustrated in FIG. 30, the mask 63 may be partially removed using the second material layer 63b, an etch stop layer, such that side portions of the plurality of nanocores 65a are exposed.

In the present exemplary embodiment, the etching process may be applied in the conditions for selectively removing the third material layer 63c to thus only remove the third material layer 63c and allow the first and second material layers 63a and 63b to remain. In the present etching process, the second material layer 63b may be used as an etch stop layer, and in a subsequent process, the second material layer 63b may prevent an active layer 65b and a second conductivity-type semiconductor layer 65c from contacting the base layer 62, together with the first material layer 63a.

When necessary, the heat treatment process described with reference to FIGS. 22 and 23 may be applied to improve crystal quality of the nanocores 65a.

Figure 31:
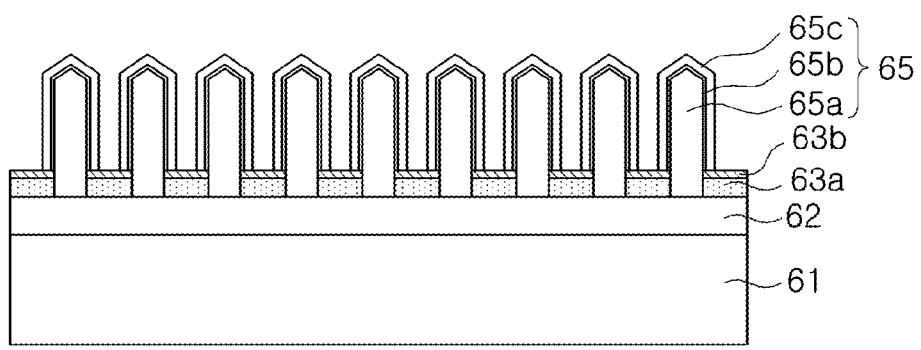

Then, as illustrated in FIG. 31, the active layer 65b and the second conductivity-type semiconductor layer 65c may be sequentially grown on the surfaces of the plurality of nanocores 65a.

Through the processes described above, the light emitting nanostructure 65 may have a core-shell structure in which the first conductivity-type semiconductor is provided as the nanocores 65a, and the active layer 65b and the second conductivity-type semiconductor layer 65c surrounding the nanocore 65a are provided as shell layers.

The active layer 65b may have a multiple quantum well (MQW) structure in which quantum well layers and quantum barrier layers are alternately stacked on top of each other, for example, may have an GaN/InGaN structure in the case of a nitride semiconductor. Here, a single quantum well (SQW) structure may also be used.

The second conductivity-type semiconductor layer 65c may be a crystal satisfying p-type $Al_xIn_yGa_{1-x-y}N$, where $0 \le x < 1$, $0 \le y < 1$, and $0 \le x+y < 1$. The second conductivity-type semiconductor layer 65c may further include an electron stopping layer (not shown) on a portion thereof adjacent to the active layer 65b. The electron stopping layer (not shown) may have a structure in which a plurality of different compositional $Al_xIn_yGa_{1-x-y}N$ layers, where $0 \le x < 1$, $0 \le y < 1$, and $0 \le x+y < 1$, are stacked or may have at least one or more layers configured of $Al_yGa_{(1-y)}N$, where $0 \le y < 1$. The electron stopping layer (not shown) may have a bandgap greater than that of the active layer 65b to thus prevent electrons from flowing to the second conductive (p-type) semiconductor layer 65c.

As such, although the present exemplary embodiment illustrates the case in which the light emitting nanostructure 65 has a core-shell structure and a rod form by way of example, the exemplary embodiments should not be considered to be limiting. That is, the light emitting nanostructure 65 may be variously formed, for example, may have a pyramid form or a form in which pyramid and rod forms are combined.

In the exemplary embodiment described above, since the mask is used as a mold for the growth of the nanocores, the mask may directly contact the surfaces of nanocores to be subsequently grown. In this case, since the semiconductor growth process for nanocores is performed at a relatively high temperature, a component of the mask may be diffused toward the nanocores to cause a deterioration in crystalline properties thereof. In order to prevent such defects, a scheme in which a diffusion preventing film is employed on side walls of openings of the mask may be additionally proposed herein.

FIGS. 32 to 38 are cross-sectional views illustrating respective main processes of a method of manufacturing a nanostructure semiconductor light emitting device according to another exemplary embodiment (the use of a diffusion preventing film).

Figure 32:
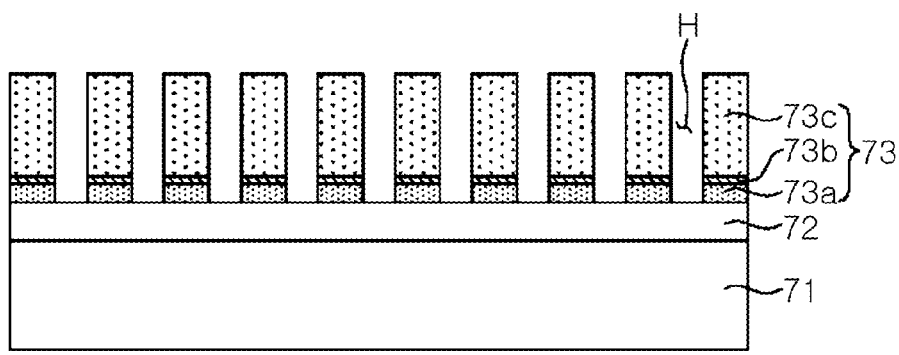
FIGS. 32 through 38 are cross-sectional views illustrating respective main processes of a method of manufacturing a nanostructure semiconductor light emitting device according to another exemplary embodiment (the use of a diffusion preventing film)

As illustrated in FIG. 32, a base layer 72 may be provided on a substrate 71, and on the base layer 72, a mask 73 having a plurality of openings H formed therein and an etch stop layer 73b interposed therein may be formed.

The mask 73 employed in the present exemplary embodiment may have a similar structure to the mask 63 described in the afore-mentioned exemplary embodiment. That is, the mask may include first to third material layers 73a, 73b and 73c formed sequentially on the base layer 72. The second material layer 73b may be provided as the etch stop layer and may be formed of a material different to those of the first and third material layers 73a and 73c. The first and third material layers 73a and 73c may be formed of the same material.

Under the etching conditions of the third material layer 73c, at least the second material layer 73b has an etching rate lower than that of the third material layer 73c, and thus, the second material layer 73b may serve as an etch stop layer. At least the first material layer 73a may be formed of a material having electrical insulation properties, and the second and third material layers 73b and 73c may be formed of an insulating material as needed.

The first to third material layers 73a, 73b and 73c may be formed of different materials from one another to obtain a necessary difference in etching rates. Unlike this case, such a difference in etching rates may be realized using pore density. In this case, the second and third material layers 73b and 73c may be formed of the same material but the material may have different pore densities.

Figure 33:
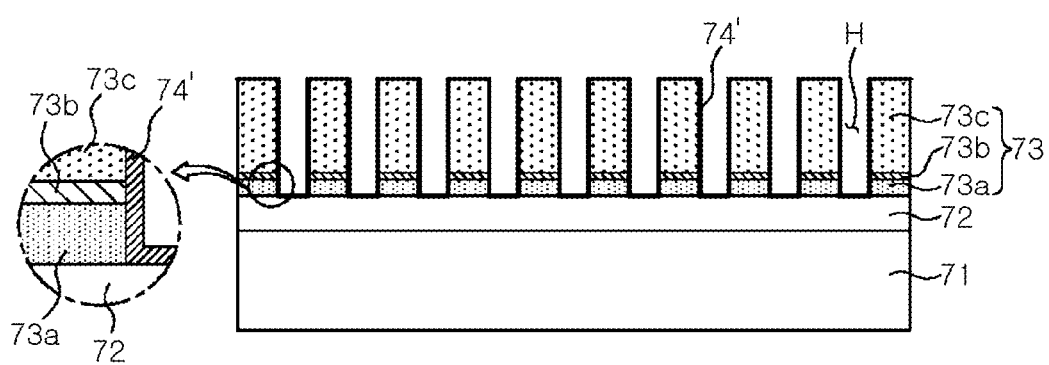
Figure 34:
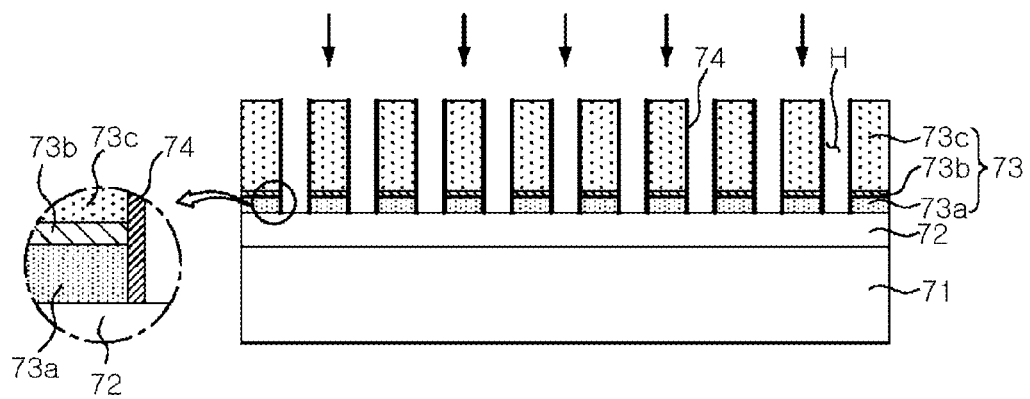

Next, FIGS. 33 and 34 illustrate a process of forming a diffusion preventing film on a side wall of the opening by way of example. First, as illustrated in FIG. 33, a material film 74' for the diffusion preventing film may be formed on the surface of the mask 73.

The material film 74' used as the diffusion preventing film may be formed of a material having thermal stability higher than that of a material used for the mask 73 (specifically, the third material layer 73c). For example, as this material film, TiN, TaN or a combination thereof may be used. Since such material film 74' has excellent thermal stability as compared with a general mask such as a SiO$_2$ mask, the material film 74' may be used as a diffusion preventing film.

Then, as illustrated in FIG. 34, portions of the material film 74', may be selectively removed such that only the material film 74' remains on an inner side wall of the openings H, thereby obtaining a desired diffusion preventing film 74.

A portion for the diffusion preventing film 74 is limited to a side wall of the openings H directly in contact with a nanocore 75a and the mask 73. Thus, in this process, portions of the material film 74' positioned on the upper surface of the mask 73 and the exposed regions of the base layer 73 are removed to obtain the diffusion preventing film 74. In particular, if the diffusion preventing film remains on the exposed regions of the base layer 72, it may be difficult to perform a follow-up crystal growth, and thus, the portions of diffusion preventing film 74 positioned on the exposed regions of the base layer 72 need to be removed.

Since the side wall of the openings H is approximately vertically formed, such a selective removal process may be performed in a manner of only removing a material film positioned on the upper surface of the mask 73 and the exposed regions of the base layer 72 through an anisotropic etching such as dry etching.

Figure 35:
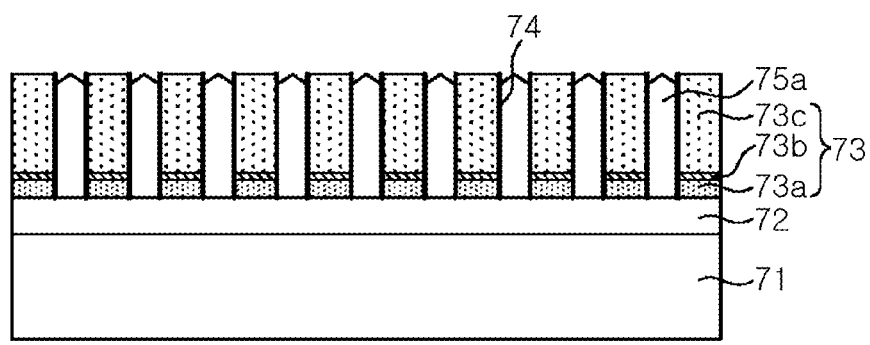

As illustrated in FIG. 35, then, the plurality of nanocores 75a may be formed by allowing a first conductivity-type semiconductor to be grown on the exposed regions of the base layer 72 to fill the plurality of openings H.

The first conductivity-type semiconductor of the nanocores 75a may be an n-type nitride semiconductor, for example, may be a crystal satisfying n-type Al$_x$In$_y$Ga$_{1-x-y}$N, where 0≤x<1, 0≤y<1, and 0≤x+y<1. A nitride single crystal configuring the nanocores 75a may be formed through the MOCVD process or the MBE process. The mask 73 may serve as a mold for the grown nitride single crystal to provide nanocores 75a having a form corresponding to that of the openings H.

By disposing the diffusion preventing film 74 between the mask 73 and the nanocores 75a, an element (e.g., silicon (Si)) of the mask 73 is prevented from being diffused to the nanocores 75a.

Figure 36:
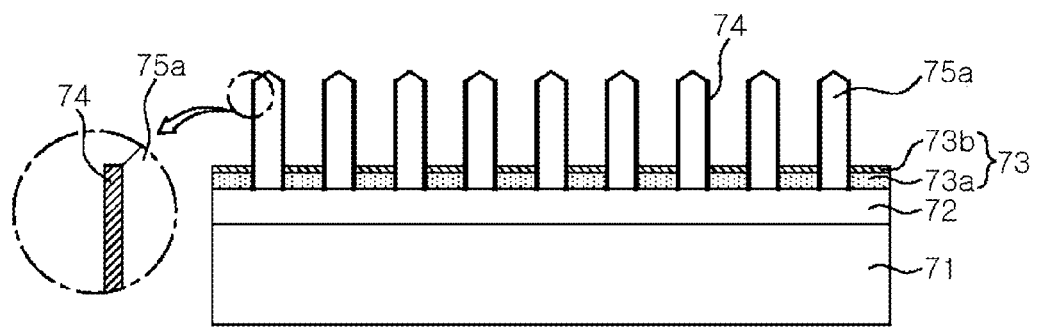

Next, as illustrated in FIG. 36, the mask 73 may be partially removed using the second material layer 73b, the etch stop layer, such that side portions of the plurality of nanocores 75a are exposed.

In the present exemplary embodiment, the etching process in the condition that the third material layer 73c is selectively removed may be applied to only remove the third material layer 73c with allowing the first and second material layers 73a and 73b to remain.

Figure 37:
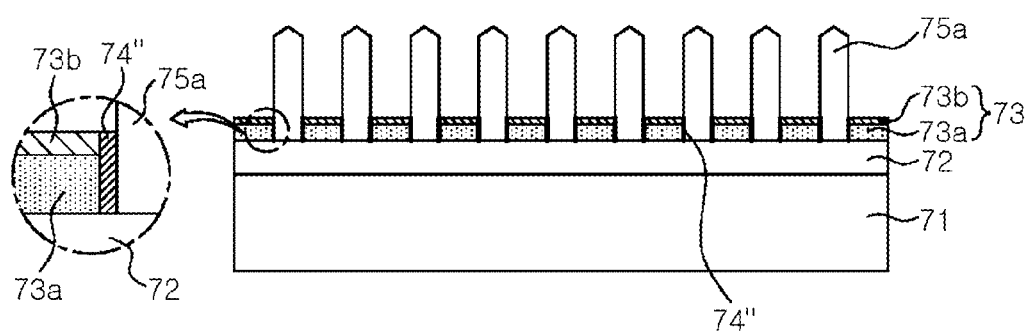

Then, as illustrated in FIG. 37, the diffusion preventing film 74 may be removed from the exposed surface of the nanocore 75a.

Since the diffusion preventing film 74 is formed of a relatively stabilized material, the diffusion preventing film 74 may not be removed in the preceding etching process of removing the third material layer 73a, but may remain on the surface of the nanocore 75a. As such, in the case in which the diffusion preventing film 74 remains, it is difficult to perform a follow-up crystal growth process. Thus, in this case, it may be necessary to remove the diffusion preventing film 74 to expose a crystal plane of the nanocore 75a.

The diffusion preventing film 74 may be removed through a separate etching process of removing a material forming the diffusion preventing film 74. Even when such a removal process is applied, a residual mask, that is, the first and second material layers, and non-removed portions of the diffusion preventing film between the nanocores 75a may not be removed, that is, may remain. Since these portions may not be used as crystal growth surfaces, bad influences do not act on the nanostructure semiconductor light emitting device.

When necessary, the heat treatment process described with reference to FIGS. 22 and 23 may be applied to improve crystal quality of the nanocores 75a.

Figure 38:
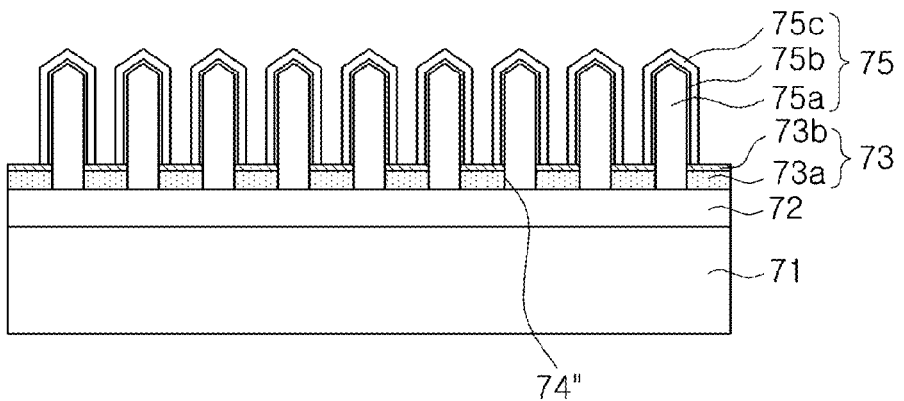

Next, as illustrated in FIG. 38, the active layer 75b and the second conductivity-type semiconductor layer 75c may be sequentially grown on the surfaces of the plurality of nanocores 75a.

Through the processes described above, the light emitting nanostructure 75 may have a core-shell structure in which the first conductivity-type semiconductor is provided as the nanocores 75a, and the active layer 75b and the second conductivity-type semiconductor layer 75c surrounding the nanocore 75a are provided as shell layers.

The active layer 75b may have a multiple quantum well (MQW) structure in which quantum well layers and quantum barrier layers are alternately stacked on top of each other, for example, may have an GaN/InGaN structure in the case of a nitride semiconductor. Here, a single quantum well (SQW) structure may also be used.

The second conductivity-type semiconductor layer 75c may be a crystal satisfying p-type $Al_xIn_yGa_{1-x-y}N$, where $0 \leq x < 1$, $0 \leq y < 1$, and $0 \leq x+y < 1$. The second conductivity-type semiconductor layer 75c may further include an electron stopping layer (not shown) on a portion thereof adjacent to the active layer 75b.

Figure 39:
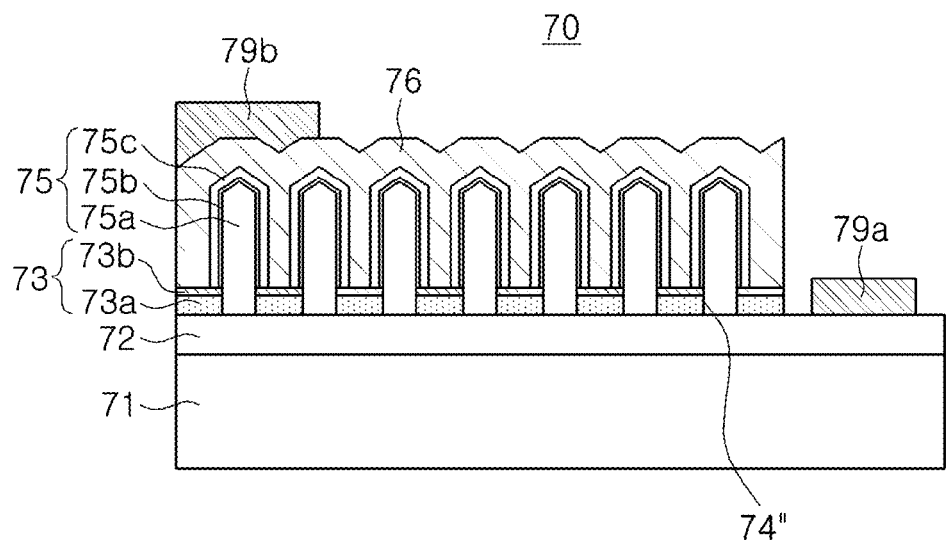
FIG. 39 is a cross-sectional view illustrating an example of a final structure in a nanostructure semiconductor light emitting device provided in FIG. 38.

As described above, the nanostructure semiconductor light emitting device obtained in the present exemplary embodiment may include an electrode having various structures. FIG. 39 illustrates an example of a nanostructure semiconductor light emitting device employing another electrode structure, an example of a final structure of the nanostructure semiconductor light emitting device obtained with reference to FIG. 38.

As illustrated in FIG. 39, the nanostructure semiconductor light emitting device 70 may include a plurality of light emitting nanostructures 75 formed over the substrate 71.

The light emitting nanostructures 75 may be light emitting nanostructures 75 described above with reference to FIG. 38. In the present exemplary embodiment, the light emitting nanostructure 75 may include a residual diffusion preventing film 74" positioned between the nanocore 75c and an inner side wall of the openings H. The residual diffusion preventing film 74" may be formed of a material having relatively excellent thermal stability as compared with a mask configuring material, and as this material, TiN, TaN or a combination thereof may be used.

The nanostructure semiconductor light emitting device 70 according to the present example may include a contact electrode layer 76 in the form of filling the light emitting nanostructures 75. The contact electrode layer 76 may structurally stabilize the light emitting nanostructure 75 while forming ohmic-contact with the second conductivity-type semiconductor layer 75c. The nano structure semiconductor light emitting device 70 may include first and second electrodes 79a and 79b respectively connected to the base layer 72 configured of the first conductivity-type semiconductor and the contact electrode layer 76.

FIGS. 40 through 43 are cross-sectional views illustrating sequential processes in obtaining nanocores using a mask 83 of a specific example.

Figure 40:
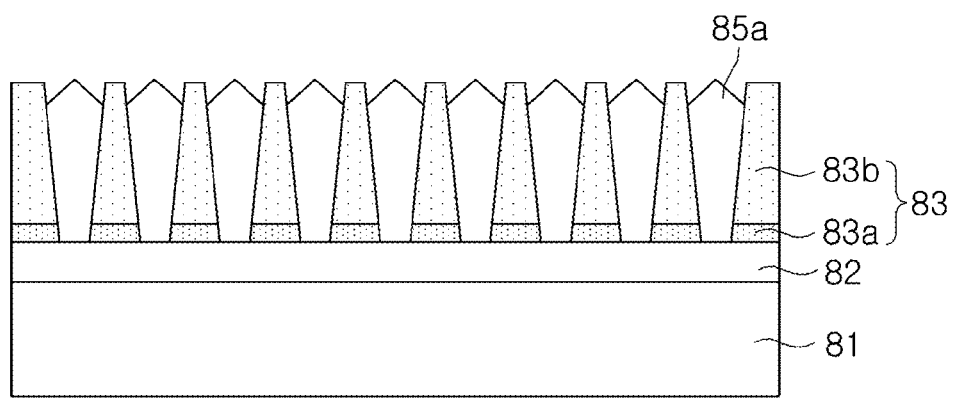
FIGS. 40 through 43 are cross-sectional views illustrating processes in obtaining nanocores.

As illustrated in FIG. 40, nanocores 85a may be grown on a base layer 82 using a mask 83. The mask 83 has openings H having a width decreased toward a lower portion thereof. The nanocores 85a may be grown to have shapes corresponding to those of the openings H.

In order to further enhance crystal quality of the nanocores 85a, a heat treatment process may be performed one or more times during the growth of the nanocores 85a. In particular, a surface of an upper part of each nanocore 85a may be rearranged to have a hexagonal pyramidal crystal plane, thus obtaining a stable crystal structure and guaranteeing high quality in crystal grown in a follow-up process.

The heat treatment process may be performed under the temperature conditions as described above. For example, for process convenience, the heat treatment process may be performed at a temperature equal or similar to the growth temperature of the nanocores 85a. Also, the heat treatment process may be performed in a manner of stopping a metal source such as TMGa, while maintaining pressure and a temperature equal or similar to the growth pressure and temperature of the nanocores 85a. The heat treatment process may be continued for a few seconds to tens of minutes (for example, 5 seconds to 30 minutes), but a sufficient effect may be obtained even with a time duration ranging from approximately 10 seconds to 60 seconds.

The heat treatment process introduced during the growth process of the nanocores 85a may prevent degeneration of crystallinity caused when the nanocores 85a are grown at a fast speed, and thus, rapid crystal growth and excellent crystal quality may be promoted.

A time of a heat treatment process section and the number of heat treatment processes for stabilization may be variously modified according to a height and diameter of final nanocores. For example, in a case in which a width of each opening ranges from 300 nm to 400 nm and a height of each opening (thickness of the mask) is approximately 2.0 μm, a stabilization time duration ranging from approximately 10 seconds to 60 seconds may be inserted at a middle point, i.e., approximately 1.0 μm to grow cores having desired height quality. The stabilization process may be omitted according to core growth conditions.

Figure 41:
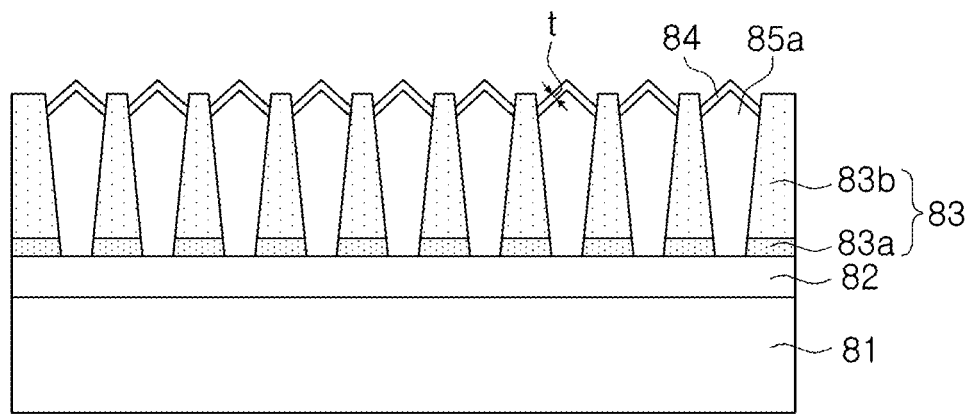

Subsequently, as illustrated in FIG. 41, a current suppressing intermediate layer 84, a highly resistive layer, may be formed on the upper part of the nanocores 85a.

After the nanocores 85a are formed to have a desired height, the current suppressing intermediate layer 84 may be formed on the surfaces of the upper parts of the nanocores 85a with the mask 83 retained as is. Thus, since the mask 83 is used as is, the current suppressing intermediate layer 84 may be easily formed in the desired regions (the surface of the upper parts) of the nanocores 85a without a process of forming an additional mask.

The current suppressing intermediate layer 84 may be a semiconductor layer purposefully not doped or may be a semiconductor layer doped with a second conductivity-type impurity opposite to that of the nanocores 85a. For example, in a case in which the nanocores 85a are n-type GaN, the current suppressing intermediate layer 84 may be undoped GaN or GaN doped with magnesium (Mg) as a p-type impurity. In this case, by changing types of an impurity during the same growth process, the nanocores 85a and the current suppressing intermediate layer 84 may be continuously formed. For example, in a case of stopping silicon (Si) doping and injecting magnesium (Mg) and growth of the same for approximately 1 minute under the same conditions as those of the growth of the n-type GaN nanocores, the current suppressing intermediate layer 84 having a thickness ranging from approximately 200 nm to 300 nm may be formed, and such a current suppressing intermediate layer 84 may effectively block a leakage current of a few μA or more. In this manner, the current suppressing intermediate layer may be simply formed during the mold-type process as in the present exemplary embodiment.

Figure 42:
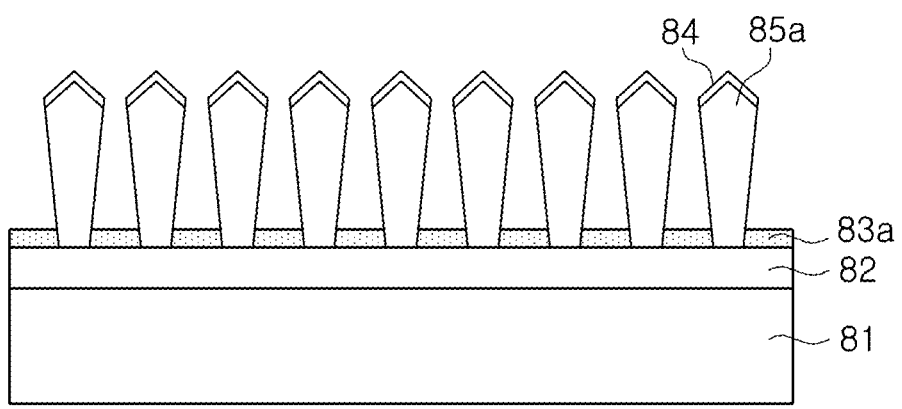

Subsequently, as illustrated in FIG. 42, portions of the mask layer 83 to reach the first material layer 83a as an etch-stop layer are removed to expose side surfaces of the plurality of nanocores 85a.

In the present exemplary embodiment, by applying the etching process of selectively removing the second material layer 83b, only the second material layer 83b may be removed, while the first material layer 83a may be retained. The residual first material layer 83a may serve to prevent the active layer and the second conductivity-type semiconductor layer from being connected to the base layer 82 in a follow-up growth process.

In the present exemplary embodiment, an additional heat treatment process may be introduced during the process of forming the light emitting nanostructures using the mask having openings as a mold in order to enhance crystallinity.

Figure 43:
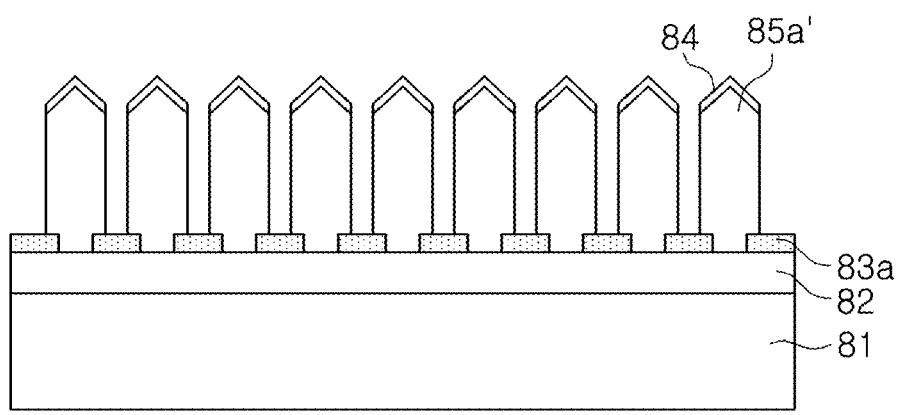

After the second material layer 83b of the mask 83 is removed, the surfaces of the nanocores 85a may be heat-treated under predetermined conditions to change unstable crystal planes of the nanocores 85a into stable crystal planes (please refer to FIGS. 22 and 23). In particular, in the present exemplary embodiment, since the nanocores 85a are grown on the openings having sloped side walls, the nanocores 85a have the sloped side walls corresponding to the shape of the openings. However, after the heat treatment process is performed, crystals are rearranged and regrown so the nanocores 85a' may have a substantially uniform diameter (or width) greater than the diameter of the openings H as illustrated in FIG. 43. Also, the upper parts of the nanocores 85a may have an incomplete hexagonal pyramidal shape immediately after being grown, but the nanocores 85a' after the heat treatment process may have a hexagonal pyramidal shape having uniform surfaces. In this manner, the nanocores having a non-uniform width after the removal of the mask may be regrown (and rearranged) to have a hexagonal pyramidal columnar structure having a uniform width through the heat treatment process.

Hereinafter, the results of the regrowth (rearrangement) of the nanocores based on the heat treatment process as described above will be described through a specific Experimental Example.

Experimental Example

Heat Treatment Process

Figure 44:
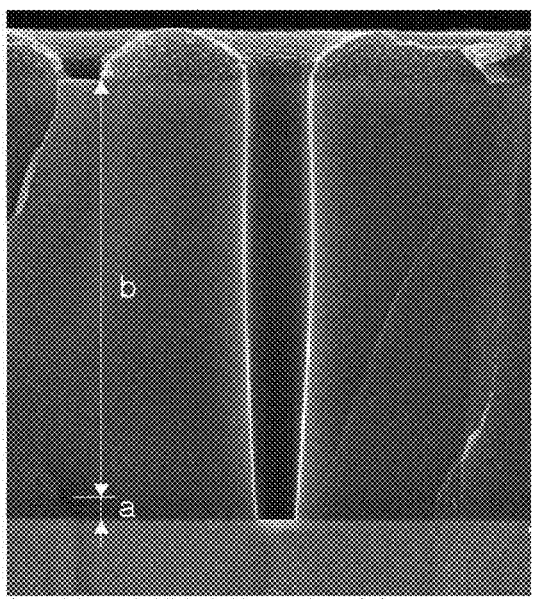
FIG. 44 is a scanning electron microscope (SEM) photograph employed in an experimental example.

Two layers of SiN/SiO$_2$ were formed on an n-type GaN base layer and openings were formed. Here, the SiN layer ("a" in FIG. 44) was formed to have a thickness of approximately 100 nm and the SiO$_2$ layer ("b" in FIG. 44) was formed to have a thickness of 2500 nm. Openings of the mask were formed by performing etching with a plasma obtained by combining C$_4$F$_8$, O$_2$ and, Ar for approximately 5 minutes through a photoresist (layer positioned on "b" in FIG. 44) process. FIG. 44 is a scanning electron microscope (SEM) photograph obtained by imaging a cross-section of an opening obtained through the process. As illustrated in FIG. 44, the opening in the mask has a width decreased toward a lower portion thereof.

Nanocores were grown on the openings of the mask using an MOCVD process. Here, TMGa and NH$_3$ were used as source gases, and nanocores were grown for approximately 20 minutes, while the temperature of a substrate was maintained at approximately 1100° C.

In order to enhance crystal quality of the nanocores, a stabilization process (heat treatment process) was additionally performed during the growth of the nanocores. Namely, when the nanocores 35a were grown to reach a height of approximately 1.0 μm, a desired intermediate point (approximately 10 minutes) of the nanocores, supply of a TMGa source was stopped and a heat treatment was performed at a temperature (approximately 1100° C.) similar to that of the substrate during the growth for approximately 30 seconds to 50 seconds under an NH$_3$ atmosphere. Subsequently, nanocores were re-grown under the conditions similar to the growth conditions before a heat treatment process.

Figure 45:
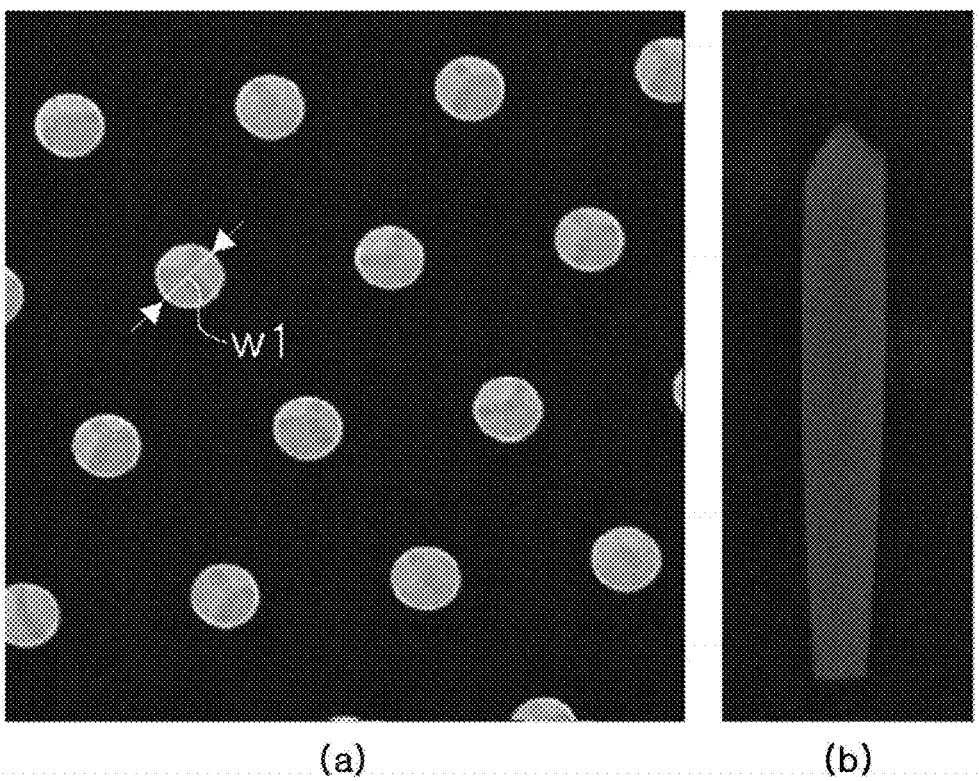
FIGS. 45(a) and 45(b) are SEM photographs obtained by imaging a planar arrangement of nanocores and a lateral cross-sectional structure grown using a mask employed in an experimental example.

After the growth of the desired nanocores was completed, the SiO$_2$ layer ("b" of FIG. 44) of the mask was removed. The nanocores corresponding to the shape of the openings appeared to have a cylindrical shape having sloped side walls (please refer to FIG. 45). The nanocores having the cylindrical structure were determined to have a height of approximately 2467 nm and a diameter of approximately 350 nm.

After the mask was removed, a heat treatment process was applied. Namely, the heat treatment process was performed at a substrate temperature of approximately 1100° C. (1000° C. to 1200° C.) for approximately 20 minutes (15 minutes to 25 minutes).

Figure 46:
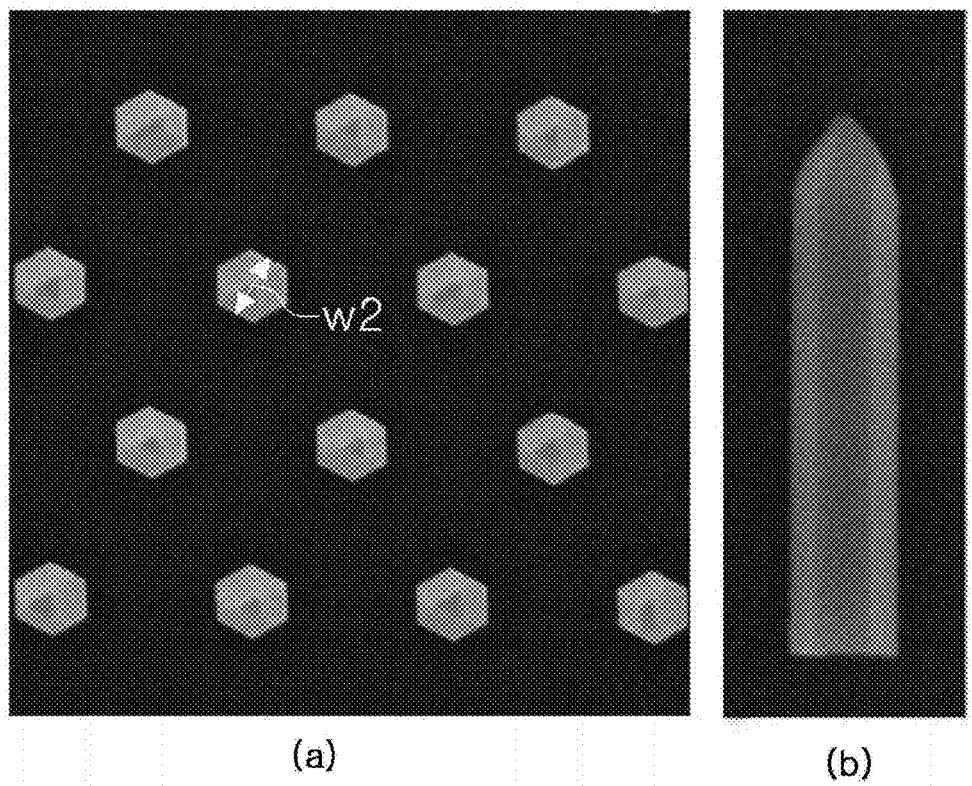
FIGS. 46(a) and 46(b) are SEM photographs obtained by imaging a planar arrangement of nanocores and a lateral cross-sectional structure heat-treated in an experimental example.

After the heat treatment process, crystals of the nanocores were regrown and rearranged, and it was confirmed that the diameter which was not uniform in the height direction was changed into a substantially uniform diameter and the incomplete hexagonal pyramidal shape of the upper parts of the nanocores was changed into a hexagonal pyramidal shape having uniform surfaces after the heat treatment process (please refer to FIG. 46).

In detail, a diameter w1 of each nanocore before the heat treatment process was 350 nm, but after the heat treatment process, the width (w2: interfacial interval of the hexagon) was approximately 410 nm, approximately 60 nm or greater. Also, it was confirmed that, while a degree of increase is smaller, a height of each nanocore was changed from 2467 nm to 2470 nm, exhibiting an increase of approximately 3 nm.

As in the Experimental Example, it was confirmed that the nanocores having an uneven width after the removal of the mask was regrown (and rearranged) to have the hexagonal pyramidal columnar structure having a uniform width through the heat treatment process.

During the foregoing heat treatment process, a size and a shape of the nanocores after the regrowth may be relatively changed depending on a heat treatment process temperature (namely, a substrate temperature) and a heat treatment process time, whether or not a source gas is supplied, or an amount of supplied source gas. For example, heat treatment may be performed at a temperature of 1000° C. or higher for 5 or more minutes in a state in which supply of a source gas is stopped, crystals may be rearranged on the surface of the nanocores, reducing a change in size of nanocores due to an etching effect (namely, N evaporation). The change in the diameter of the nanocores may be maintained at a level of 50% or less in consideration of a process time, condition, and cost. As described above, uniformity of the diameter (or width) of the nanocores may be maintained at 95% or more. In this case, the diameter of each nanocore grown in a group in which sizes of openings of the mask are equal may be substantially equal.

The above-described exemplary embodiment exemplifies a method of manufacturing a nanostructure semiconductor light emitting device, for growth of nanocores using a mask having openings, as a mold. However, the method according to the above-described exemplary embodiment may be modified or improved in various exemplary embodiments.

At least a portion of nanocores among the plurality of nanocores may be designed such that at least one of cross-sectional areas (or diameters) and intervals between the at least a portion of nanocores are different to those of remaining nanocores.

By designing any one of the cross-sectional areas (or diameters) of the light emitting structures and intervals therebetween to be differentiated, even when the same active layer formation process is applied thereto, a plurality of different wavelengths of light may be emitted. As described above, since a plurality of different wavelengths of light are emitted by differentiating the design of nanostructures, white light may be obtained in a single device. FIGS. 47 through 50 are cross-sectional views illustrating respective main processes in a method of manufacturing a white nanostructure semiconductor light emitting device according to another exemplary embodiment of the present inventive concept (a polishing process introduction).

Figure 47:
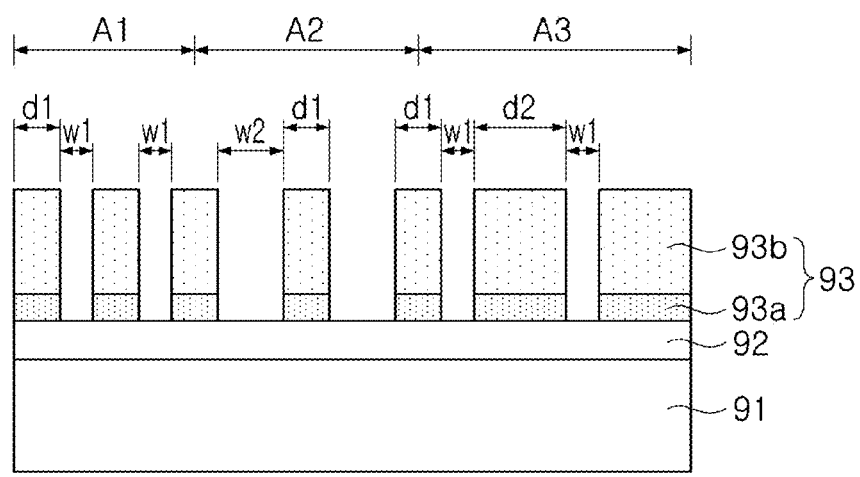
FIGS. 47 through 50 are cross-sectional views illustrating main processes in a method of manufacturing a nanostructure semiconductor light emitting device according to an exemplary embodiment of the present inventive concept.

First, as illustrated in FIG. 47, a mask 93 having a plurality of openings H and an etch stop layer interposed therein may be formed on a base layer 92 formed on a substrate 91.

Similar to the example illustrated in FIG. 2, the mask 93 according to the present exemplary embodiment may include a first material layer 93a formed on the base layer 92, and a second material layer 93b formed on the first material layer 93a and having an etching rate greater than that of the first material layer 93a.

The openings H may be formed to have different patterns. In detail, in the present exemplary embodiment, three different groups of openings may be formed. Openings of a second group A2 have an interval d1 therebetween the same as an interval d2 between openings of a first group A1, and may have a width w2 greater than a width w1 of the openings of the first group A1. An openings of a third group A3 may have a width w1 the same as the width w1 of the openings of the first group A1, and the openings of the third group A3 may have an interval d2 therebetween greater than the interval d1 between the openings of the first group A1.

Substantially, the increase in an interval between the openings indicates a relative increase in a contact amount of source gas with regard to the same area, and thus, a growth speed of nanocores 95a may be relatively rapid. The increase in a width of the opening indicates a relative reduction in the contact amount of source gas in the same area, and thus, the growth speed of the nanocores 95a may be relatively slow.

In this exemplary embodiment, the configuration in which the interval d between the openings and the width w of the openings are differentiated is illustrated, but two or more groups may also be formed by differentiating only any one of the interval d between the openings and the width w of the openings. Here, light emitted from the two or more groups may complement each other, or the two or more groups may be configured to emit white light when combined. For example, in the case of two groups, the two groups may be desired such that when one group emits blue light, the other group emits yellow light. In the case of three groups, any one of the intervals d between the openings and the widths w of the openings may be differentially designed to emit blue, green, and red light, respectively.

As the interval between the openings increases, wavelength of light increases, and thus, an active layer emitting blue light may be obtained from a group in which the interval d between openings is relatively small, and an active layer emitting red light may be obtained from a group in which the interval d between openings is relatively large. As the interval d between the openings increases, thicknesses (lateral direction with respect to the core) of the active layer and/or the second conductivity-type semiconductor layer tend to increase. Thus, in general, a diameter of light emitting nanostructure (a nanocore, an active layer, and a second conductivity-type semiconductor layer) emitting red light may be greater than those of light emitting nanostructures emitting blue and green light, and the diameter of the light emitting nanostructure emitting green light may be greater than that of the light emitting nanostructure emitting green light.

Figure 48:
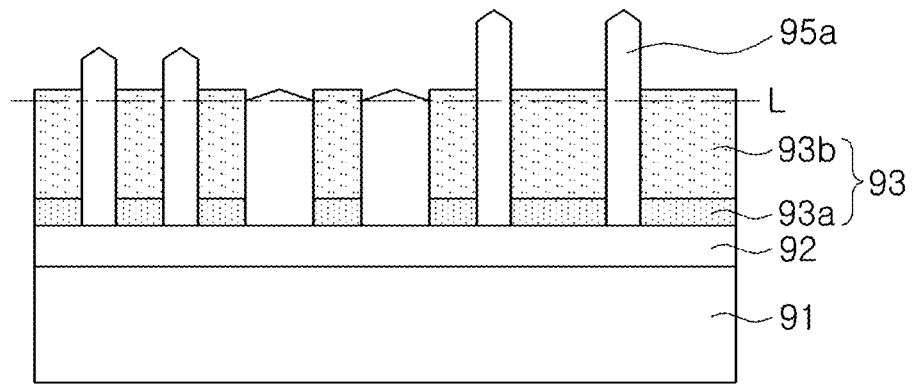

As described above, the nanocores 95a may have different heights for respective groups, for example, three groups, due to the difference in a growth speed of the nanocores 95a between the width of the opening and the interval between the openings as illustrated in FIG. 48. In order to improve the non-uniform height, planarization to form an appropriate level L1 may be performed in the present process as illustrated in FIGS. 48 and 49, thereby achieving a uniform height of the nanocores 95a per respective group.

Since the mask 93 is used as a structure supporting the nanocores 95a in the planarization process as described above, the planarization process may be easily performed without damage to the nanocores 95a. The planarization process may be performed after a core-shell structure and a contact electrode are formed, and in this case, the planarization process applied in this stage may be omitted.

Figure 49:
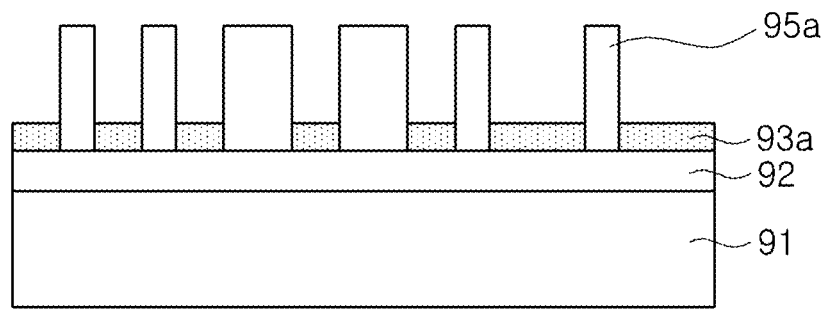

The mask 93 may be partially removed to expose side portions of the planarized nanocores 95a as illustrated in FIG. 49. That is, in the removal process, the second material layer 93b may only be removed and the first material layer 93a may remain.

Figure 50:
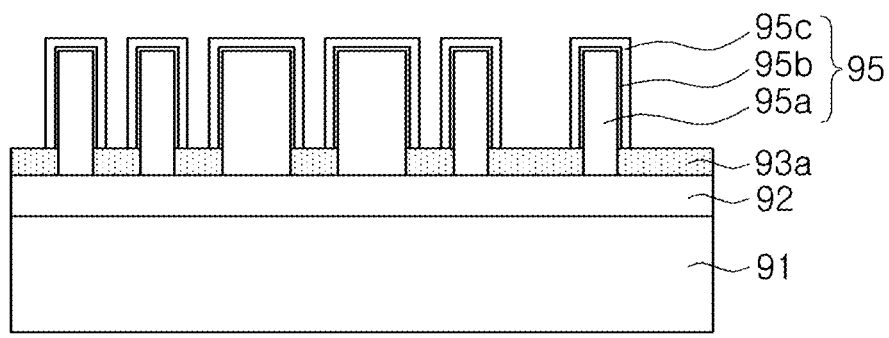

Subsequently, an active layer 95b and a second conductivity-type semiconductor layer 95c may be sequentially grown on the surfaces of the plurality of nanocores 95a as illustrated in FIG. 50.

Through the above-mentioned process, the light emitting nanostructure 95 may have a core-shell structure in which the first conductivity-type semiconductor is provided as the nanocores 95a, and the active layer 95b and the second conductivity-type semiconductor layer 95c surrounding the nanocore 95a are provided as shell layers.

As such, although the present exemplary embodiment provides the case in which the light emitting nanostructure 95 has a rod form in the core-shell structure, exemplary embodiments of the inventive concept should not be considered to be limiting. The light emitting nanostructure according to exemplary embodiments may have various different forms such as in a pyramid structure or in a structure in which a pyramid form and a rod form are combined.

In the aforementioned exemplary embodiment, the planarization process of FIGS. 48 and 49 may be omitted, and white light emitting device may be manufactured using light emitting nanostructures having a core-shell structure using the nanocores 95a having different heights. A process of growth of nanocores and a process of forming electrodes of a light emitting structure may be performed in the same manner as those of the exemplary embodiments described above.

The nanostructure semiconductor light emitting device according to the exemplary embodiment as described above may be implemented to various packages.

Figure 51:
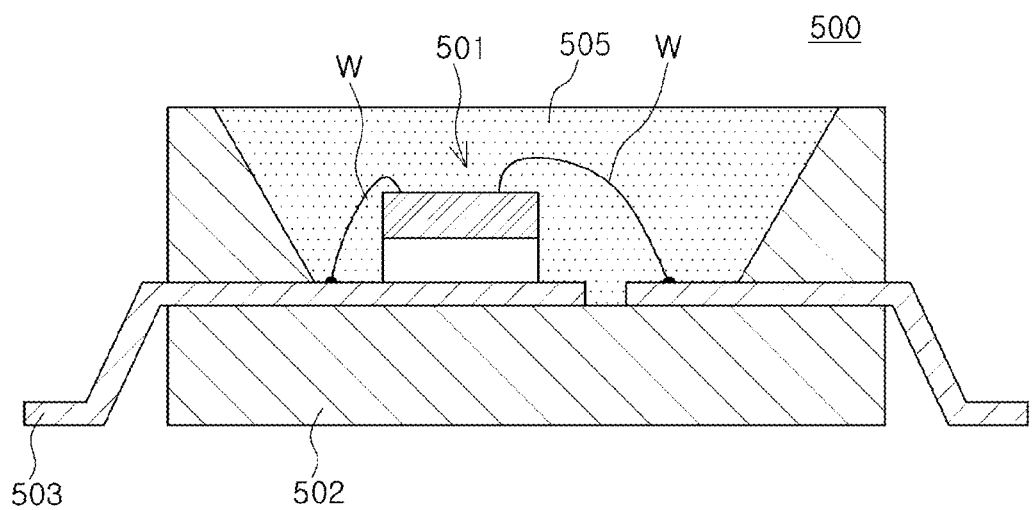
FIGS. 51 and 52 are views illustrating various examples of a semiconductor light emitting device package employing a semiconductor light emitting device according to an exemplary embodiment of the present inventive concept.
Figure 52:
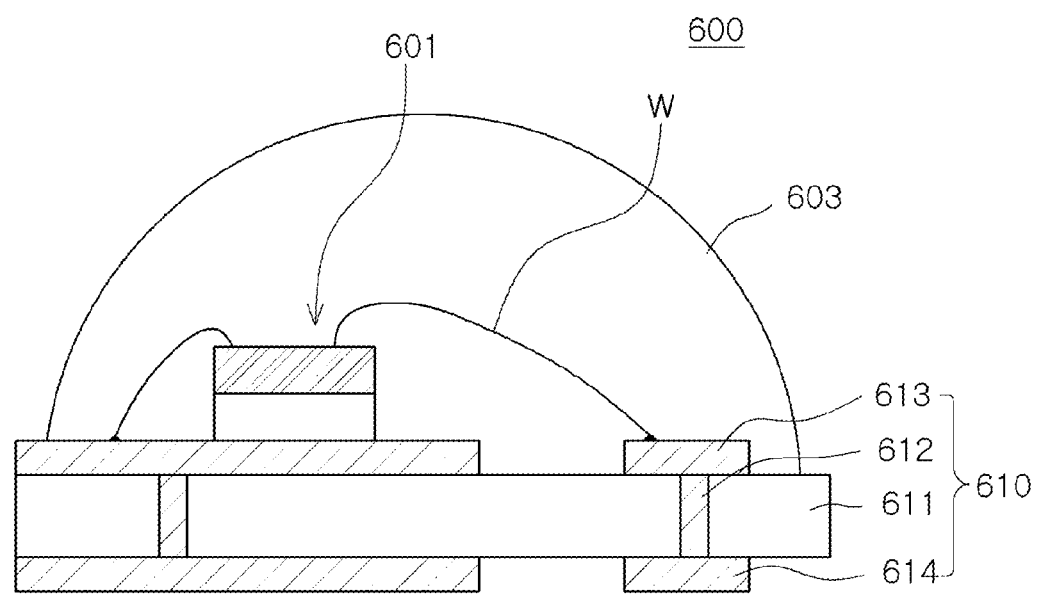

FIGS. 51 and 52 are views illustrating examples of a package employing the foregoing semiconductor light emitting device.

A semiconductor light emitting device package 500 illustrated in FIG. 51 may include a semiconductor light emitting device 501, a package body 502, and a pair of lead frames 503.

The semiconductor light emitting device 501 may be the aforementioned nanostructure semiconductor light emitting device. The semiconductor light emitting device 501 may be mounted on the lead frames 503 and electrically connected to the lead frames 503 through wires W.

If necessary, the semiconductor light emitting device 501 may be mounted on a different region, for example, on the package body 502, rather than on the lead frames 503. Also, the package body 502 may have a cup shape to improve reflectivity efficiency of light. An encapsulant 505 formed of a light-transmissive material may be formed in the reflective cup to encapsulate the semiconductor light emitting device 501, the wire W, and the like.

A semiconductor light emitting device package 600 illustrated in FIG. 52 may include a semiconductor light emitting device 601, a mounting board 610, and an encapsulant 603.

A wavelength conversion unit 602 may be formed on a surface and a side surface of the semiconductor light emitting device 601. The semiconductor light emitting device 601 may be mounted on the mounting board 610 and be electrically connected to the mounting board 610 through a wire W.

The mounting board 610 may include an upper electrode 613, a lower electrode 614, and a through electrode 612 connecting the upper electrode 613 and the lower electrode 614. The mounting board 610 may be provided as a board such as a PCB, an MCPCB, an MPCB, an FPCB, or the like, and the structure of the mounting board 610 may be applied to have various forms.

The wavelength conversion unit 602 may include a phosphor, a quantum dot, or the like. The encapsulant 603 may be formed to have a lens structure with an upper surface having a convex dome shape. However, according to an exemplary embodiment, the encapsulant 603 may have a lens structure having a convex or concave surface to adjust a beam angle of light emitted through an upper surface of the encapsulant 603.

The nanostructure semiconductor light emitting device and a package having the same according to the exemplary embodiment as described above may be advantageously applied to various application products.

Figure 53:
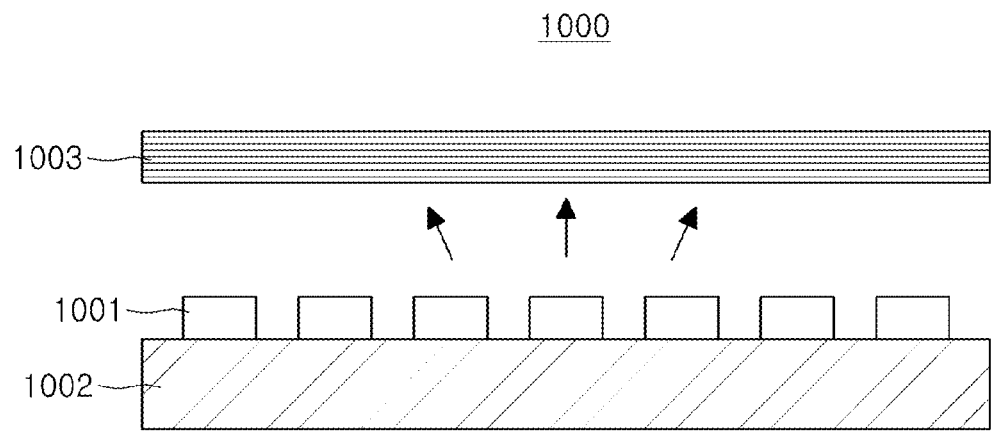
FIGS. 53 and 54 are views illustrating a backlight unit employing a semiconductor light emitting device according to an exemplary embodiment of the present inventive concept.
Figure 54:
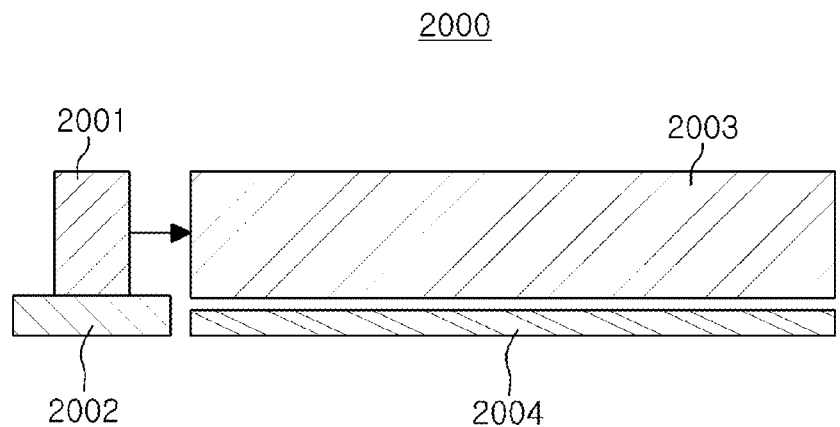

FIGS. 53 and 54 are views illustrating a backlight unit employing a semiconductor light emitting device according to an exemplary embodiment of the present inventive concept.

Referring to FIG. 53, a backlight unit 1000 includes light sources 1001 mounted on a substrate 1002 and one or more optical sheets 1003 disposed above the light sources 1001. The aforementioned semiconductor light emitting device or a package employing the semiconductor light emitting device may be used as the light sources 1001.

Unlike the backlight unit 1000 in FIG. 53 in which the light sources 1001 emit light toward an upper side on which a liquid crystal display is disposed, a backlight unit 2000 as another example illustrated in FIG. 54 is configured in such a way that light sources 2001 mounted on a board 2002 emit light in a lateral direction, and the emitted light may be incident to a light guide plate 2003 so as to be converted into a surface light source. Light, passing through the light guide plate 2003, is emitted upwardly, and in order to enhance light extraction efficiency, a reflective layer 2004 may be disposed on a lower surface of the light guide plate 2003.

Figure 55:
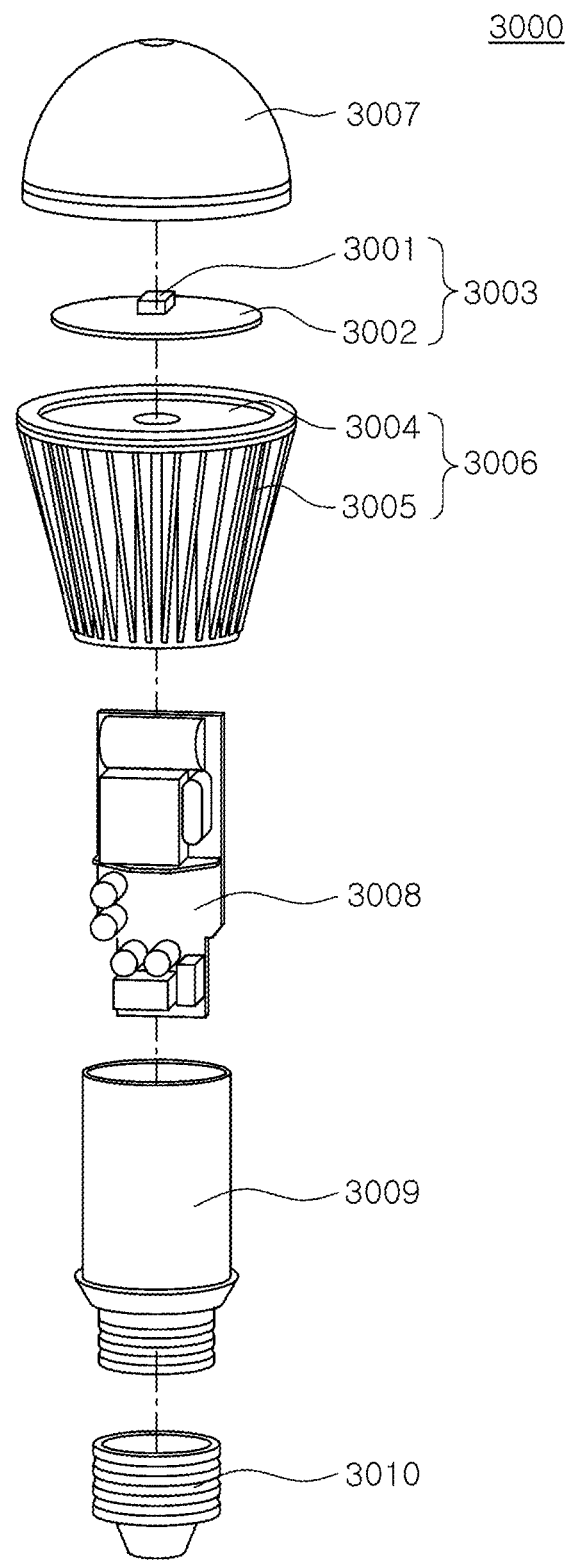
FIG. 55 is an exploded perspective view illustrating an example of a lighting device employing a semiconductor light emitting device according to an exemplary embodiment of the present inventive concept.

FIG. 55 is an exploded perspective view illustrating an example of a lighting device employing a semiconductor light emitting device according to an exemplary embodiment of the present inventive concept.

A lighting device 3000 is illustrated, for example, as a bulb-type lamp in FIG. 55, and includes a light emitting module 3003, a driving unit 3008, and an external connection unit 3010.

Also, the lighting device 3000 may further include external structures such as external and internal housings 3006 and 3009 and a cover unit 3007. The light emitting module 3003 may include a light source 3001 having the aforementioned semiconductor light emitting device package structure or a structure similar thereto and a circuit board 3002 with the light source 3001 mounted thereon. For example, the first and second electrodes of the aforementioned semiconductor light emitting device may be electrically connected to an electrode pattern of the circuit board 3002. In the present exemplary embodiment, it is illustrated that a single light source 3001 is mounted on the circuit board 3002, but a plurality of light sources may also be mounted as needed.

The external housing 3006 may serve as a heat dissipation unit and may include a heat dissipation plate 3004 disposed to be in direct contact with the light emitting module 3003 to enhance heat dissipation and heat dissipation fins 3005 surrounding the side surfaces of the lighting device 3000. Also, the cover unit 3007 may be installed on the light emitting module 3003 and have a convex lens shape. The driving unit 3008 is installed in the internal housing 3009 and connected to the external connection unit 3010 having a socket structure to receive power from an external power source. Also, the driving unit 3008 may serve to convert power into an appropriate current source for driving the semiconductor light emitting device 3001 of the light emitting module 3003, and may provide the same. For example, the driving unit 3008 may be configured as an AC-DC converter or a rectifying circuit component.

Figure 56:
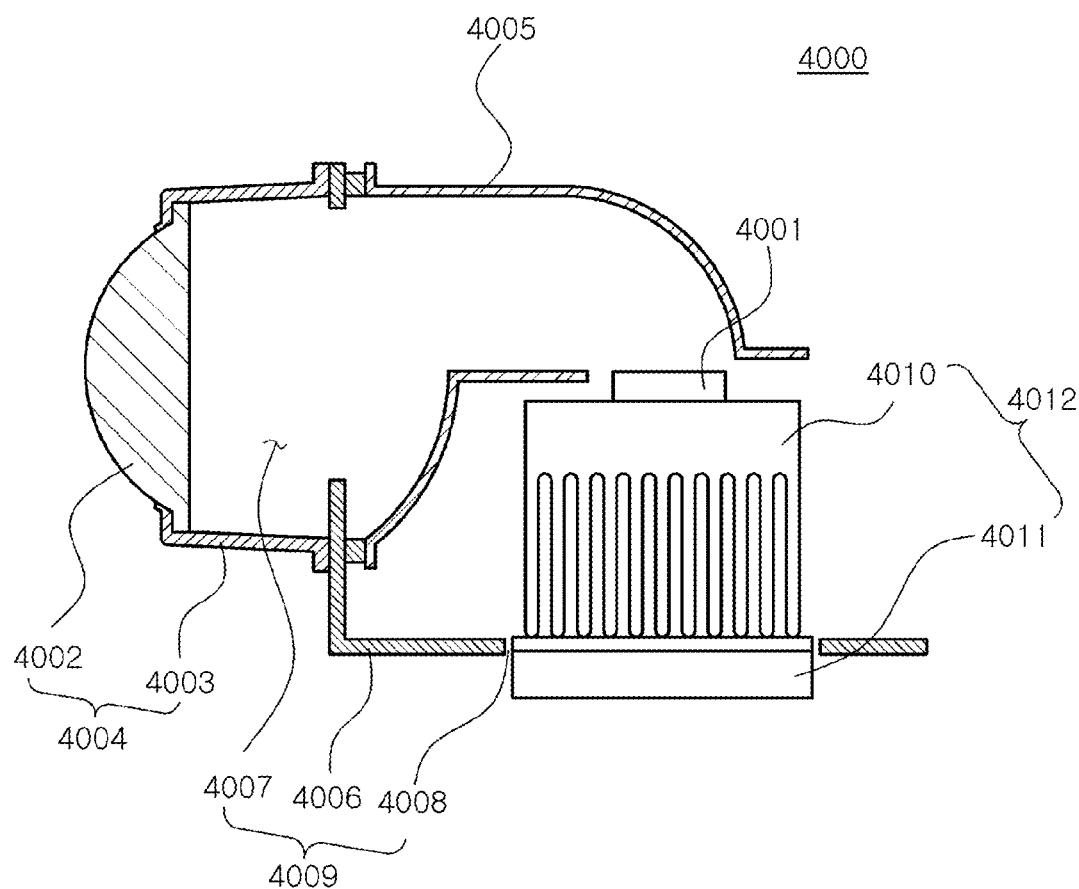
FIG. 56 is a view illustrating an example of a headlamp employing a semiconductor light emitting device according to an exemplary embodiment of the present inventive concept.

FIG. 56 is a view illustrating an example of a headlamp employing a semiconductor light emitting device according to an exemplary embodiment of the present inventive concept.

Referring to FIG. 56, a headlamp 4000 used as a vehicle lamp, or the like, may include a light source 4001, a reflective unit 4005, and a lens cover unit 4004. The lens cover unit 4004 may include a hollow guide 4003 and a lens 4002. The light source 4001 may include the aforementioned semiconductor light emitting device or a package including the semiconductor light emitting device.

The headlamp 4000 may further include a heat dissipation unit 4012 outwardly dissipating heat generated by the light source 4001. In order to effectively dissipate heat, the heat dissipation unit 4012 may include a heat sink 4010 and a cooling fan 4011. Also, the headlamp 4000 may further include a housing 4009 fixedly supporting the heat dissipation unit 4012 and the reflective unit 4005, and the housing 4009 may have a central hole 4008 formed in one surface thereof, in which the heat dissipation unit 4012 is coupled.

The housing 4009 may have a front hole 4007 formed in the other surface integrally connected to the one surface and bent in a right angle direction. The front hole 4007 may allow the reflective unit 4005 to be fixedly positioned above the light source 4001. Accordingly, a front side is open by the reflective unit 4005, and the reflective unit 4005 is fixed to the housing 4009 in such a way that the open front side corresponds to the front hole 4007, and light reflected by the reflective unit 4005 may pass through the front hole 4007 so as to be externally output.

While exemplary embodiments have been shown and described above, it will be apparent to those skilled in the art that modifications and variations could be made without departing from the scope of the invention as defined by the appended claims.

The invention claimed is:

1. A method of manufacturing a nanostructure semiconductor light emitting device, the method comprising:
 providing a base layer formed of a first conductivity-type semiconductor;
 forming a mask including an etch stop layer on the base layer;
 forming a plurality of openings with regions of the base layer exposed therethrough, in the mask;
 forming a plurality of nanocores by growing the first conductivity-type semiconductor on the exposed regions of the base layer to fill the plurality of openings, entire side surfaces of the plurality of the nanocores being defined by a shape of the openings;
 partially removing the mask using the etch stop layer to expose side portions of the plurality of nanocores;
 regrowing the plurality of nanocores by supplying a source gas for the first conductivity-type semiconductor; and
 sequentially growing an active layer and a second conductivity-type semiconductor layer on surfaces of the plurality of nanocores.

2. The method of claim 1, wherein the mask includes a first material layer formed on the base layer and provided as the etch stop layer, and a second material layer formed on the first material layer and having an etching rate lower than an etching rate of the first material layer.

3. The method of claim 1, wherein the mask includes a first material layer, a second material layer, and a third material layer formed sequentially on the base layer, and the second material layer is formed of a material different from materials of the first and third material layers and is provided as the etch stop layer.

4. The method of claim 3, wherein the first and third material layers are formed of the same material.

5. The method of claim 1, wherein an etch stop level through the etch stop layer is positioned at a depth equal to or below a point equal to ⅓ of an overall height of the mask, from an upper surface of the base layer.

6. The method of claim 1, wherein an aspect ratio of the opening is about 5:1 or higher.

7. The method of claim 1, further comprising forming a diffusion preventing film formed of a material different from a material of the mask on respective inner side walls of the plurality of openings, between the forming of the plurality of openings and the forming of the plurality of nanocores.

8. The method of claim 7, wherein the forming of the diffusion preventing film includes forming a material film for the diffusion preventing film on a surface of the mask, and removing portions of the material film, positioned on an upper surface of the mask and the exposed regions of the base layer such that only the material film remains on an inner side wall of the opening.

9. The method of claim 7, further comprising removing the diffusion preventing film from the exposed surface of the nanocores, before the sequentially growing of the active layer and the second conductivity-type semiconductor layer.

10. The method of claim 7, wherein after the removing of the diffusion preventing film, a portion of the diffusion preventing film positioned below an upper surface level of the etch stop layer remains.

11. The method of claim 1, wherein widths of the regrown nanocores are larger than widths of the nanocores prior to the regrowing.

12. The method of claim 1, further comprising, after the forming of the plurality of nanocores, applying a planarizing process to upper surfaces of the plurality of nanocores to be planarized to have the same level.

13. The method of claim 12, wherein at least a portion of the plurality of nanocores have a diameter that is different from a diameter of other nanocores of the plurality of nanocores, or at least a portion of the plurality of nanocores have an interval therebetween that is different from an interval between other nanocores of the plurality of nanocores.

* * * * *